United States Patent
Crockett et al.

(10) Patent No.: US 8,929,567 B2
(45) Date of Patent: *Jan. 6, 2015

(54) EQUALIZATION PROFILES FOR DYNAMIC EQUALIZATION OF AUDIO DATA

(75) Inventors: Brett Graham Crockett, Brisbane, CA (US); Alan J. Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 452 days.

This patent is subject to a terminal disclaimer.

(21) Appl. No.: 13/300,489

(22) Filed: Nov. 18, 2011

(65) Prior Publication Data
US 2012/0063615 A1    Mar. 15, 2012

Related U.S. Application Data

(63) Continuation of application No. PCT/US2010/034683, filed on May 13, 2010.

(60) Provisional application No. 61/181,206, filed on May 26, 2009, provisional application No. 61/226,676, filed on Jul. 17, 2009.

(51) Int. Cl.
| | |
|---|---|
| H03G 5/00 | (2006.01) |
| G10L 21/02 | (2013.01) |
| H03G 5/16 | (2006.01) |
| H03G 9/00 | (2006.01) |
| G10L 19/018 | (2013.01) |

(52) U.S. Cl.
CPC ............ *G10L 21/0205* (2013.01); *H03G 5/165* (2013.01); *G10L 19/018* (2013.01)
USPC .............................................. 381/98; 381/102

(58) Field of Classification Search
CPC ......... H03G 3/32; H03G 9/025; H03G 5/165; H03G 9/14; H04R 2205/024; H04R 5/02; H04S 7/307; H04S 7/30; H04S 2420/01
USPC ............... 381/98, 103, 104, 57; 704/E19.002
See application file for complete search history.

(56) References Cited

U.S. PATENT DOCUMENTS

| | | | |
|---|---|---|---|
| 6,182,030 B1 | 1/2001 | Hagen | |
| 6,341,166 B1 | 1/2002 | Basel | |

(Continued)

FOREIGN PATENT DOCUMENTS

| | | |
|---|---|---|
| EP | 1437828 | 7/2004 |
| RU | 2241305 | 11/2004 |

(Continued)

OTHER PUBLICATIONS

Wikipedia, The Free Encyclopedia, "Equalization ", Wikimedia Foundation, Inc. Retrieved Nov. 26, 2008 from http://en.wikipedia.org/wiki/Equalization.

(Continued)

*Primary Examiner* — Paul S Kim
*Assistant Examiner* — Ammar Hamid
(74) *Attorney, Agent, or Firm* — Dov Rosenfeld; Inventek

(57) ABSTRACT

Apparatuses for and methods of carrying out dynamic equalization processing of an audio signal, and apparatuses for and methods of controlling such equalization processing of the audio signal to dynamically adjust the time-varying spectrum of an audio signal to more closely match a user specified target time-invariant perceived audio signal spectrum while preserving the original dynamic range of the audio signal. The dynamic equalization is carried out according to a user-defined spectral profile specified by a control interface that allows a user to define, create, modify and/or apply the user-defined spectral profile.

31 Claims, 10 Drawing Sheets

(56) References Cited

U.S. PATENT DOCUMENTS

| | | | |
|---|---|---|---|
| 6,704,421 | B1 | 3/2004 | Kitamura |
| 2002/0001395 | A1 | 1/2002 | Davis |
| 2003/0108209 | A1* | 6/2003 | McIntosh .................. 381/74 |
| 2003/0235317 | A1 | 12/2003 | Baumgarte |
| 2005/0195995 | A1 | 9/2005 | Baumgarte |
| 2005/0249272 | A1 | 11/2005 | Kirkeby |
| 2005/0265560 | A1* | 12/2005 | Haulick et al. .................. 381/58 |
| 2007/0092089 | A1 | 4/2007 | Seefeldt |
| 2007/0174059 | A1 | 7/2007 | Rhoads |
| 2007/0291959 | A1 | 12/2007 | Seefeldt |
| 2008/0044087 | A1 | 2/2008 | Levy |
| 2008/0075303 | A1 | 3/2008 | Kim |
| 2008/0080607 | A1 | 4/2008 | Shah |
| 2009/0048848 | A1 | 2/2009 | Krig |
| 2009/0097676 | A1 | 4/2009 | Seefeldt |

FOREIGN PATENT DOCUMENTS

| | | |
|---|---|---|
| RU | 2279758 | 7/2006 |
| RU | 2284648 | 9/2006 |
| WO | WO 2004111994 | 12/2004 |
| WO | WO 2005121950 | 12/2005 |
| WO | WO 2006047600 | 5/2006 |
| WO | WO 2006047600 A1 * | 5/2006 |
| WO | WO 2007047037 | 4/2007 |
| WO | WO 2007120453 | 10/2007 |
| WO | WO 2008105070 | 9/2008 |
| WO | WO 2008113012 | 9/2008 |

OTHER PUBLICATIONS

Trapani et al: "Signal Processing Through Dynamic Equalization", 79th Convention of the Audio Engineering Society, Oct. 1985, 2309 (D-16).

International Search Report and Written Opinion of the Intellectual Searching Authority on PCT Application PCT/US2010/034559 mailed Aug. 5, 2010.

International Preliminary Report on Patentability on PCT Application PCT/US2010/034559 mailed Jul. 13, 2011.

PowerCore, "Manual for PowerCore," 2007, available from TC Electronics A/S, Sindalvej 34, Rissov DK-8240, Denmark. Downloaded Dec. 11, 2008 at http://www.tcelectronic.com/media/Powercore_01 (1) .pdf.

Soundtrack Pro: How to use the Match EQ plug-in, dated Jun. 20, 2007, downloaded Dec. 10, 2008 at http://support.apple.com/kb/TA23246?viewlocale=en_US.

Craig Anderton, "Curves of Steal: Fabulous Frequency Felons", Downloaded Dec. 11, 2008 at http://www.harmony-central.com/articles/tips/curves_of_steal/.

Apple Computer, Inc., 2004, "Logic Pro 7 Plug in Reference," Apple Computer, Inc., 1 Infinite Loop, Cupertino, CA 95014-2084.

Sony Creative Software Inc., XFX 2 DirectX Audio Plug-Ins, Downloaded Dec. 11, 2008 at http://www.sonycreativesoftware.com/products/showproduct.asp?PID=8&FeatureID=244.

Aleksey Vaneev, "Voxengo: CurveEQ", Downloaded Dec. 11, 2008 at http://www.voxengo.com/product/curveeq/.

Seefeldt, Alan, "Loudness Domain Signal Processing" AES Convention Paper 7180, presented at the 123rd Convention Oct. 5-8, 2007, New York, USA.

Wikipedia, The Free Encyclopedia, "Equalization Filter" Oct. 3, 2006, Wikimedia Foundation, Inc. Retrieved Dec. 6, 2011 from http://en.wikipedia.org/w/index.php?title=Equalization_filter&oldid=79195244.

Wikipedia, The Free Encyclopedia, "Cryptographic hash function", Wikimedia Foundation, Inc. Retrieved Jul. 7, 2009 from http://en.wikipedia.org/wiki/Cryptographic_hash_function.

International Search Report and Written Opinion of the Intellectual Searching Authority on PCT Application PCT/US2010/034683 mailed Oct. 19, 2010.

International Preliminary Report on Patentability on PCT Application PCT/US2010/034683 mailed Oct. 11, 2011.

* cited by examiner

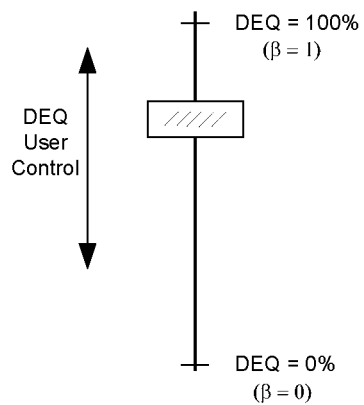
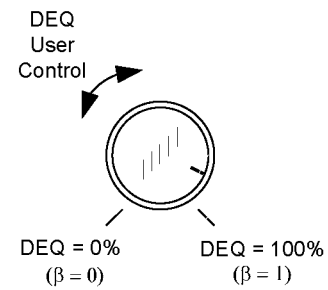
FIG. 7A    FIG. 7B
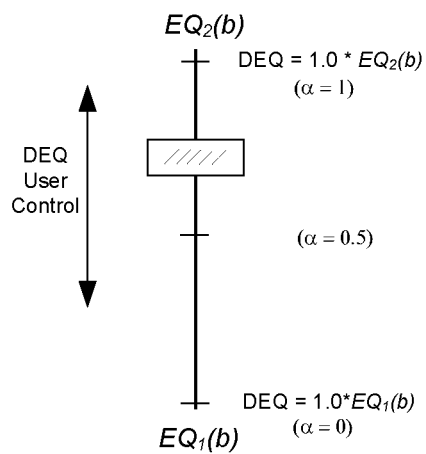
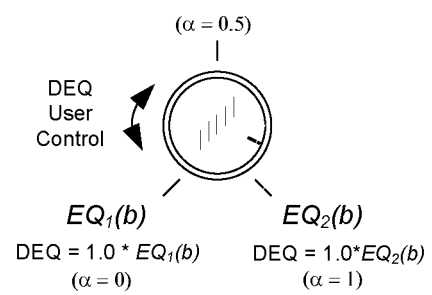
FIG. 8A    FIG. 8B

US 8,929,567 B2

EQUALIZATION PROFILES FOR DYNAMIC EQUALIZATION OF AUDIO DATA

RELATED PATENT APPLICATIONS

The present application is a continuation filed under 35 U.S.C. 111(a) of International Patent Application No. PCT/US2010/034683 having International filing date of 13 May 2010 and titled EQUALIZATION PROFILES FOR DYNAMIC EQUALIZATION OF AUDIO DATA, the contents of which are incorporated herein by reference. International Patent Application No PCT/US2010/034683 claims priority of U.S. Provisional Patent Application No. 61/181,206 filed May 26, 2009 to inventors Crockett et al., and titled AUDIO SIGNAL DYNAMIC EQUALIZATION PROCESSING CONTROL, and further claims priority of U.S. Provisional Patent Application No. 61/226,676 filed Jul. 17, 2009 to inventors Crockett et al., and titled EQUALIZATION PROFILES FOR DYNAMIC EQUALIZATION OF AUDIO DATA. The contents of each of such U.S. 61/181,206 and U.S. 61/226,676 are incorporated herein by reference.

FIELD OF THE INVENTION

The present disclosure relates generally to signal processing of media data, such as signal processing of signal data for quality enhancement.

BACKGROUND

Equalization processing of an audio signal is commonly used to alter the frequency response of an audio signal to be within a user specified range and is typically achieved by using an equalization filter whose frequency response can be adjusted by a user for one or more reasons, such as the resulting audio signal having improved fidelity, emphasizes certain frequencies or ranges of frequencies, has undesired frequency components such as noise removed, and/or matches perceived timbre of multiple audio signal pieces, such as songs on a CD or multiple compressed MP3 audio signal files. Audio signal equalization is also commonly used in film and television production to improve the quality of the sound, modify and/or match the timbre of audio signal in different scenes or to match individual audio signal streams which comprise a film or television soundtrack. Audio signal equalization can also be used to modify specific frequencies and to make an audio signal perceptually louder, as well as to compensate for frequency dependent deficiencies in an audio signal reproduction apparatus.

Many types of equalizations are known. Such equalizations, however, do not take into account the time varying nature of the audio signal itself.

Recently, perceptual domain processing has been invented that takes into account the variation in the perception of audio depending on the reproduction level of the audio signal. See, for example, International Application PCT/US2004/016964, published as WO 2004111994. Such processing includes determining and adjusting the perceived loudness of an audio signal in an improved manner. A psychoacoustic model is used to calculate a measure of the loudness of an audio signal in perceptual units. Such perceptual domain loudness measure is referred to as specific loudness, and is a measure of perceptual loudness as a function of frequency and time. When applied to equalization, the process is called dynamic equalization (DEQ). What is called "perceptual domain dynamic equalization" (PDEQ) is carried out in a perceptual domain to transform the time-varying perceived spectrum of the audio signal to be closer to a desired time-invariant perceived spectrum. This form of equalization matches a desired target perceived spectrum while preserving the perceived dynamic range. This takes into account the dynamic range and perceived loudness of the audio signal.

Approximate perceptual level dynamic equalization includes making certain approximations in the determining of the perceived loudness to obtain an approximate measure of perceptual loudness as a function of frequency and time. Approximate dynamic equalization using the approximate spectral measure of perceived loudness includes determining a set of frequency and time domain gains to apply in order to transform the time-varying spectral measure of the audio signal to be closer to a desired time-invariant perceived spectrum.

It is known how to achieve such perceptual and approximate perceptual domain dynamic equalization processing. Related invention of U.S. 61/181,206 describes mechanisms for controlling one or more properties of the equalization using one or more pre-determined preset target dynamic equalization spectra, how much equalization to achieve. In the case of more than one preset target perceived spectra, controlling how much the ultimate target perceived spectrum includes each of the preset spectra. Related Application U.S. 61/181,206 also describes user interfaces for a user to store dynamic equalization setting, e.g., as a result of listening to audio and selecting the dynamic equalization setting used for such audio.

It would be advantageous for users to be able to create dynamic equalization settings as dynamic equalization profiles that are usable by others. It also would be advantageous to save such dynamic equalization settings in a predefined format that would be agreed upon by others, so would be accepted by audio playback devices. It also would be advantageous to save such dynamic equalization settings in a predefined format that allows authentication. This would allow users to share their favorite dynamic equalization settings with friends and others, similarly to how people share song playlists on services like iTunes. This also would allow commercial interests to distribute dynamic equalization settings for others to use.

It would be advantageous to use dynamic equalization profiles to process audio to take into account the deficiencies of the reproduction capabilities of a particular audio system, e.g., playback device or element thereof, and to process the audio accordingly. This could include a non-dynamic system calibration spectral profile that compensates for a non-flat spectral response of speakers, for example. Another advantageous use of dynamic equalization profiles is to limit reproduction of some frequencies, for example bass frequencies, which smaller systems may not be able to reproduce at louder levels without introducing distortion.

BRIEF DESCRIPTION OF THE DRAWINGS

FIG. 7A shows a basic slider control interface for dynamic equalization on a media device according to some embodiments of the present invention.

FIG. 7B shows a basic knob control interface for dynamic equalization on a media device according to some embodiments of the present invention.

FIG. 8A shows a basic slider control interface for dynamic equalization on a media device for application of two dynamic equalization predefined DEQ spectral profiles according to some embodiments of the present invention.

FIG. 8B shows a basic knob control interface for dynamic equalization on a media device for application of two dynamic equalization predefined DEQ spectral profiles according to some embodiments of the present invention.

DESCRIPTION OF EXAMPLE EMBODIMENTS

Overview

Figure 1:
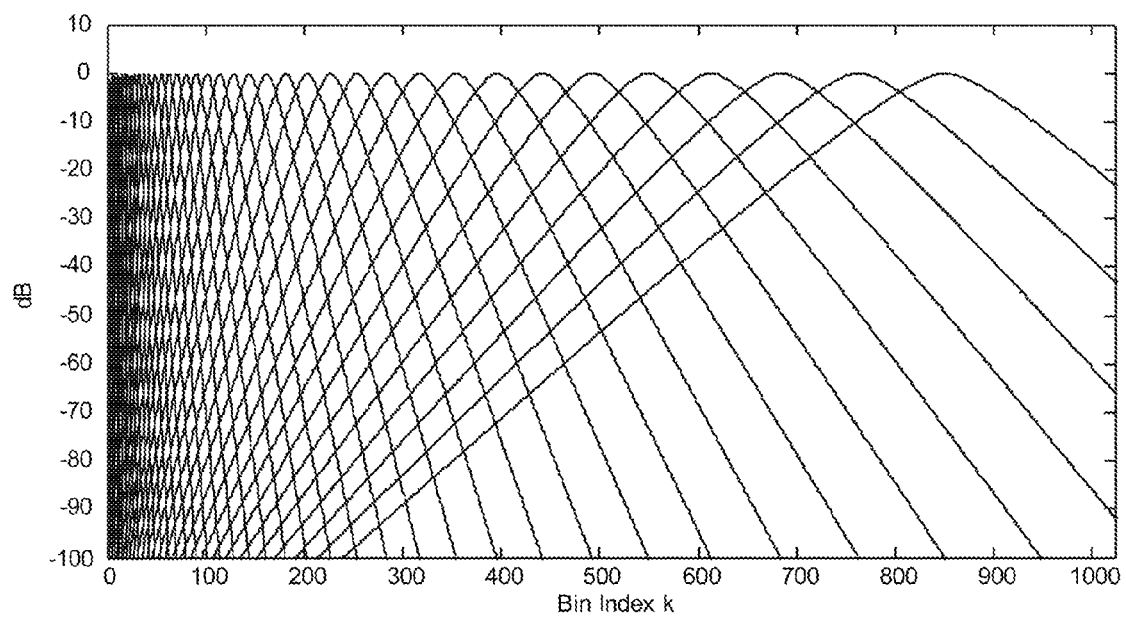
FIG. 1 shows a set of filters spaced uniformly on the Equivalent Rectangular Bandwidth (ERB) scale and used to determine frequency bands for perceptual domain processing according to embodiments of the present invention.

Described herein are apparatuses for and methods of carrying out dynamic equalization processing of an audio signal, such as perceptual domain dynamic equalization and other types of dynamic equalization, and apparatuses for and methods of controlling such equalization processing of the audio signal to dynamically adjust the time-varying spectrum of an audio signal to more closely match a user specified target time-invariant audio signal spectrum. Also described herein are computer readable media that include instructions that when executed by one or more processors of an audio signal processing apparatus carry out the methods.

Particular embodiments include a method of operating an audio signal processing apparatus to process an audio signal. The method includes accepting an audio signal and processing the audio signal using the audio signal processing apparatus according to a selected predefined dynamic equalization (DEQ) spectral profile to generate a processed audio signal. The processing includes determining a spectral measure that is modified to dynamically adjust the time-varying spectral profile of the audio signal to more closely match a time invariant spectral profile according to the selected predefined DEQ spectral profile. The processed audio signal is for playback in a reproduction environment using a reproduction apparatus.

Particular embodiments include an apparatus for selecting and using a predefined DEQ spectral profile to process an audio signal. The apparatus includes one or more processors configured in operation to process the audio signal according to a selected predefined dynamic equalization (DEQ) spectral profile to generate a processed audio signal. The processing includes determining a spectral measure that is modified to dynamically adjust the time-varying spectral profile of the audio signal to more closely match a time invariant spectral profile according to the selected predefined DEQ spectral profile. The processed audio signal is for playback in a reproduction environment using a reproduction apparatus.

Particular embodiments include a method of operating a processing system for providing predefined dynamic equalization (DEQ) spectral profiles for use by client processing systems. The processing system includes one or more processors, a storage subsystem, and a network interface coupled to a network, such that the processing system can communicate with one or more audio signal processing apparatuses that are coupled to the network. The method comprises storing a set of predefined DEQ spectral profiles in the storage subsystem, and distributing directly, or indirectly via another processing system, one or more of the stored predefined DEQ spectral profiles to one or more audio signal processing apparatuses coupled to the network, such that a particular audio signal processing apparatus coupled to the network, as a result of receiving a selected predefined DEQ spectral profile, can process an accepted audio signal according to the selected predefined DEQ spectral profile to generate a processed audio signal. The processing includes determining a spectral measure that is modified to dynamically adjust the time-varying spectral profile of the audio signal to more closely match a time invariant spectral profile according to the selected predefined DEQ spectral profile. The processed audio signal is for playback in a reproduction environment using a reproduction apparatus.

Particular embodiments include a system for providing predefined DEQ spectral profiles for use by client processing systems. The system includes one or more processors, a storage subsystem, and a network interface coupled to a network, such that the system can communicate with one or more audio signal processing apparatuses that are coupled to the network. The storage system stores a set of predefined dynamic equalization (DEQ) spectral profiles. The one or more processors are arranged in operation to send directly, or indirectly via a different processing system, one or more of the set of stored predefined DEQ spectral profiles to at least one audio signal processing apparatus coupled to the network. A particular audio signal processing apparatus, as a result of receiving a selected predefined DEQ spectral profile, is able to process an accepted audio signal according to the selected predefined DEQ spectral profile to generate a processed audio signal. The processing including determining a spectral measure that is modified to dynamically adjust the time-varying spectral profile of the audio signal to more closely match a time invariant spectral profile according to the selected predefined DEQ spectral profile. The processed audio signal is for playback in a reproduction environment using a reproduction apparatus.

In some versions of the apparatus, the methods, or the system described in the above paragraphs of this Overview section, the processing includes perceptual domain dynamic equalization to dynamically adjust the time-varying perceived spectrum of the audio signal to more closely match the time invariant spectral profile according to the selected predefined DEQ spectral profile. In other versions, the processing includes approximately perceptual domain dynamic equalization to dynamically adjust the time-varying perceived spectrum of the audio signal to more closely match the time invariant spectral profile according to the selected predefined DEQ spectral profile.

In each of the above methods, systems, or apparatuses of this Overview section, the selected predefined DEQ spectral profile includes one or more of:

A device-specific DEQ spectral profile to equalize for one or more characteristics of the reproduction apparatus, or one or more characteristics of the reproduction environment, or characteristics of both the reproduction environment and the reproduction apparatus.

A content-specific DEQ spectral profile to equalize according to the content or type of content represented by the audio signal.

An equalization-type specific DEQ spectral profile to equalize according to a type of equalization effect.

Particular embodiments include a computer-readable storage medium configured with instructions that when executed by one or more processors of a processing system, cause carrying out the one or more steps recited in any method described in this Summary section.

One embodiment comprises a processing system including one or more processors and a storage subsystem. The storage subsystem is configured with instructions that when executed by one or more of the processors, cause carrying out the one or more steps described in any method summarized in the above paragraphs of this Overview section.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Dynamic Equalization (DEQ)

With traditional static equalization, a filter is applied to the audio signal in order to change its spectrum. Different types of such equalization filters are known that have different behavior in regards to the frequencies that they attenuate or boost. A peak equalizer raises or lowers a range of frequencies around a central point in a bell shape. A parametric equalizer is a peaking equalizer with such parameters the gain, bandwidth, and center frequency. A pass filter equalizer attenuates either high or low frequencies while allowing other frequencies to pass unfiltered. Such filters include a low pass filter, a high pass filter, and a band pass filter, which combines the properties of a high pass and low pass filter. Shelving-type equalizers increase or attenuate the level of a wide range of frequencies by a fixed amount. A low shelf will affect low frequencies up to a certain point and then above that point will have little effect. A high shelf affects the level of high frequencies, while below a certain point, the low frequencies are unaffected. It is common to combine all types of filters. A graphic equalizer, which includes controllers such as a bank of sliders or other controllers for boosting and cutting different bands (frequency ranges) of an audio signal. Spectral matching equalization is known in which it is desired to match the frequency response of a target audio signal to that of a reference audio signal. An audio engineer listens to the reference audio and manually creates an equalization setting that will make the target sound like the reference. Such manual spectral matching equalization can be very time consuming and often still yield unsatisfactory results, e.g., because of the time varying nature of the target.

Such traditional equalization processing does not take into account the spectrum of the audio signal being processed and may therefore be inappropriate for some signals. As one example, audio signals that already contain a relatively large amount of bass or treble may become unacceptable to a listener following additional frequency boosting.

Dynamic equalization (DEQ) includes measuring the time-varying spectrum of an input signal and dynamically modifying the signal in order to transform the measured spectrum to more closely match a desired static shape. If the spectrum of the audio signal is already close to that of the desired shape, then little modification is made to the audio signal. If the spectrum is significantly different from the desired shape, then the resulting modifications may be large. These modifications adapt over time as the spectrum of the processed audio signal changes relative to the spectrum of the desired shape.

Perceptual Domain Dynamic Equalization (Pdeq) and Approximate perceptual domain dynamic equalization A satisfying true dynamic equalization method may be carried out in a perceptual domain to transform the perceived spectrum of the audio signal from a time-varying perceived spectrum to be closer to a substantially time-invariant perceived spectrum. This form of equalization matches a desired target perceived spectrum while preserving the perceived dynamic range. This takes into account the dynamic range and perceived loudness of the audio signal. The process is called Perceptual Domain Dynamic EQ or PDEQ herein, and refers to an audio signal equalization method that includes intentional transformation of an audio signal's time-varying spectrum to match more closely a target time-invariant spectrum while still preserving the original dynamic range of the audio signal.

Seefeldt recently described PDEQ in International Patent Application No. PCT/US2005/038579 published as WO 2006047600 titled CALCULATING AND ADJUSTING THE PERCEIVED LOUDNESS AND/OR THE PERCEIVED SPECTRAL BALANCE OF AN AUDIO SIGNAL and International Patent Application No. PCT/US2007/007946 published as WO 2007120453 titled CALCULATING AND ADJUSTING THE PERCEIVED LOUDNESS AND/OR THE PERCEIVED SPECTRAL BALANCE OF AN AUDIO SIGNAL. Each of these applications designates the United States. The contents of each of such patent applications published as WO 2006047600 and WO 2007120453 are incorporated herein by reference. See also Alan Seefeldt: "Loudness Domain Signal Processing," paper 7180, *Proceedings, 123rd Convention of the Audio engineering Society*, New York, N.Y., USA, 5-8 Oct. 2007. US20080286799 20081001; US20070666252 20070425; WO2005US38579 20051025; WO2007US07946 20070330; US20040622458P 20041026; US20040638607P 20041221; US20060789539P 20060404

The above-mentioned Seefeldt publications describes audio signal quality enhancement signal processing methods that occur in what is called the perceptual domain. PDEQ processing methods include determining modification parameters from calculations carried out in a perceptual domain, and modifying audio signal data according to the modification parameters. By determining the modification parameters in the perceptual domain, greater control over perceptual loudness and perceived spectral balance may be achieved than if such modification parameters were derived in the electrical signal domain. In some embodiments, a basilar-membrane simulating psychoacoustic filterbank or its equivalent is used for performing loudness domain calculations. This can provide a more detailed control of the perceived spectrum than in arrangements that derive modification parameters in the electrical signal domain.

Processing in a Perceptual Domain

Often, an audio signal is expected to be reproduced at a specified reference level. However, many times, the media data is played back at reduced levels. It is known that there is variation in the perception of audio depending on the reproduction level. Such variation is related to psychoacoustics and the equal loudness contours and the threshold of hearing in quiet environments. Altered playback levels can result in dramatic differences in timbre and spatial perception of the audio when compared to the same media data played back at reference level. The perceptual domain dynamic equalization as described in embodiments of the present invention includes determining and adjusting the perceived loudness of an audio signal in an improved manner. A psychoacoustic model is used to calculate a measure of the loudness of an audio signal in perceptual units. Such perceptual domain loudness measure is referred to as specific loudness, and is a measure of perceptual loudness as a function of frequency and time. As one example, a dynamic equalization process includes determining parameters in a perceptual domain, such determining includes using a signal processing method to compute frequency and time-varying multiplicative gains, which, when applied to the audio, results in the spectral properties of the gain-modified audio being closer to or equal to a user-defined equalization or spectral balance profile. The gain adjusting methods also include signal processing methods that analyze and modify the audio depending on playback level restoring it to the way it would be perceived at the reference playback level having the or user defined equalization.

Because specific loudness is a measure of perceptual loudness of an audio signal as a function of frequency and time, in order to process a signal so that its spectral properties become closer to a substantially time invariant shape, the spectrum of the to-be-modified audio signal is generated by smoothing the specific loudness of the signal over time.

To reduce the difference between the specific loudness of the audio signal and the target specific loudness, the modifying typically modifies the audio signal as a function of both time and frequency. In the case of a time- and frequency-varying scale factor, the specific loudness may be scaled by the ratio of a measure of a desired spectral shape to the measure of a spectral shape of the audio signal. Such a scaling may be used to transform the perceived spectrum of the audio signal from a time-varying perceived spectrum to be closer to a substantially time-invariant perceived spectrum. When the specific loudness is scaled by the ratio of a measure of a desired spectral shape to the measure of a spectral shape of the audio signal, such a scaling may be usable as a perceptual domain dynamic equalizer.

One version of PDEQ includes processing each of a plurality of frequency bands by time varying gain factors that are determined from characteristics in the perceptual loudness domain. As discussed in WO 2006047600 and WO 2007120453, and for aspects of the present invention, a time sampled audio signal denoted x[n], where n is an integer sample index is pre-processed to generate a time-varying spectrum denoted by a function L[b,t], indicating a signal level denoted L within a plurality of frequency bands (critical bands), e.g., 40 bands, each denoted by a band number denoted by integer b varying over time blocks each time block denoted by an integer t. The function L[b,t] of the audio signal may be generated in a number of ways, but advantageously the bands b are spaced to simulate the frequency resolution of human hearing. The goal of PDEQ processing is to modify x[n] so that the modified audio more closely matches a desired time-invariant perceptual domain spectral shape that is specified across bands b by a quantity denoted EQ[b].

In the perceptual domain, starting with the audio signal samples x[n], a quantity called an excitation signal denoted E[b,t] is computed that approximates the distribution of energy along the basilar membrane of the inner ear of a human at a critical frequency band b during a time block t. While other transforms, such as the modified discrete cosine transform (MDCT) also may be used, the perceptual domain excitation may be achieved efficiently by computing the running Short-Time Discrete Fourier Transform (STDFT) of the audio signal denoted x[n], n=0, ..., N−1, the STDFT denoted by X[k,t], k=0, 1, ... N−1, and is computed with half overlap and window denoted w[n] according to:

$$X[k,t] = \sum_{n=0}^{N-1} w[n]x[n+tN/2]e^{-j\frac{2\pi kn}{N}} \quad (1)$$

with $j^2 = -1$.

The excitation in some embodiments is computed according to:

$$E[b,t] = \sum_{k=0}^{N-1} |T[k]|^2 |C_b[k]|^2 |X[k,t]|^2 \quad (2)$$

where T[k] represents the frequency response of a filter simulating the transmission of audio through the outer and inner ear of a human, and $C_b[k]$ are a selected set of bandpass filters. In one embodiment, the set of bandpass frequency responses $C_b[k]$ be advantageously chosen to mimic the critical band filtering observed along the basilar membrane in the human ear at critical frequency b. As discussed in WO 2006047600 and WO 2007120453, these filters exhibit an approximately rounded exponential shape and are spaced uniformly on the Equivalent Rectangular Bandwidth (ERB) scale. Example embodiments of the present invention use a set of filters with a spacing of 1 ERB, resulting in a total of 40 bands. FIG. 1 depicts a suitable set of filters with a spacing of 1 ERB, resulting in a total of 40 bands.

The specific loudness denoted N[b,t] is a spectral representation meant to simulate the manner in which a human perceives audio as a function of frequency and time. As described in WO 2006047600 and WO 2007120453, the specific loudness in general as a transformation denoted by $\Psi\{\ \}$, such that $$N[b,t] = \Psi\{E[b,t]\}. \quad (3)$$

PDEQ Processing

A PDEQ process computes a measured spectrum in the perceptual domain and modifies the signal such that a desired shape spectral denoted by Eq[b] is achieved. A multi-band perceptual-domain loudness is denoted by $L_p[b,t]$, and is a function of the input audio signals specific loudness N[b,t]. While one simple embodiment sets $L_p[b,t]$ to be the specific loudness N[b,t], in some embodiments, in order to avoid instability of the processing over time segments t, the specific loudness N[b,t] is first smoothed over time, e.g., uses a single smoothing coefficient λ to provide the smoothed specific loudness denoted $\bar{N}[b,t]$ as:

$$\bar{N}[b,t] = \lambda \bar{N}[b,t-1] + (1-\lambda)N[b,t]. \quad (4)$$

Note that, as described in WO 2006047600 and WO 2007120453, alternate embodiments might include smoothing the excitation rather than the specific loudness, in which case, the smoother excitation denoted $\bar{E}[b,t]$ is given by:

$$\bar{E}[b,t] = \lambda E[b,t-1] + (1-\lambda)E[b,t], \quad (5)$$

and Eqn. 3 for the specific loudness becomes:

$$N[b,t] = \Psi\{\bar{E}[b,t]\} \quad (6)$$

Other embodiments can use different smoothing methods, for example, including a recursive relation involving more than just the most previous time's smoothed specific loudness $\bar{N}[b,t-1]$ in the case of smoothing the specific loudness, or previous time's smoothed excitation $\bar{E}[b,t-1]$ in the case of smoothing the excitation. Furthermore, the multi-band loudness (the spectrum), $L_p[b,t]$ may be calculated by smoothing the specific loudness $\bar{N}[b,t]$ across bands so that there is not a drastic change from one band to the next. In the case of using the smoothed specific loudness, the result is a band-smoothed loudness denoted $\bar{L}_p[b,t]$ with a smoothing filter is applied:

$$\bar{L}_p[b,t] = \sum_c Q(b-c)\bar{N}[c,t] \quad (7)$$

where $Q(b)$ is a band smoothing filter.

To preserve the original dynamic range of the audio signal, the desired spectral shape $EQ[b]$ may be normalized to have the same overall level as the smoothed signal loudness denoted $\bar{L}_p[b,t]$ to generate a normalized spectral shape denoted $EQ_{NORM}[b,t]$ as:

$$EQ_{NORM}[b,t] = \left(\frac{\sum_c \bar{L}_p[c,t]}{\sum_c EQ[c]}\right) EQ[b]. \quad (8)$$

The processing is to modify the specific loudness $N[b,t]$ to achieve a target specific loudness denoted $\hat{N}_{des}[b,t]$ such that the resulting spectral shape is closer to the desired shape $EQ[b]$. Again, letting the function $\Psi\{\bullet\}$ denote the non-linear transformation from excitation to specific loudness, i.e., $N[b,t] = \Psi\{E[b,t]\}$, where the excitation may be the smoothed excitation, one embodiment determines a set of time varying multi-band gains $G_p[b,t]$ forming a time varying filter according to the relationship.

$$\hat{N}_{des}[b,t] = \Psi\{G_p^2[b,t]E[b,t]\}, \quad (9)$$

where $E[b,t]$ is in one embodiment the smoothed excitation.

The gains $G_p[b,t]$ are applied in the frequency domain to a delayed version of $X[k,t]$ that is obtained by the STDFT (or MDCT), where the delay is to account for the time needed to compute the gains. The resulting gain multiplied signal:

$$\hat{X}[k,t] = G_p[k,t]X[k,t-d]$$

where $d$ denotes the delay time, is then applied to a set of synthesis filters, denoted $S_b[k]$ for frequency band $b$ to generate a signal denoted $\hat{X}[k,t]$ where $$\hat{X}[k,t] = \sum_b G_p[k,t]S_b[k]X[k,t-d] \quad (10)$$

Solving for the gains can take on many forms. If the inverse $\Psi^{-1}\{\bullet\}$ of the transformation $\Psi\{\bullet\}$ exists, then $$G_p[b,t] = \sqrt{\frac{\Psi^{-1}\{N_{des}[b,t]\}}{E[b,t]}} \quad (11)$$

where the excitation may be the smoothed excitation. If a closed form of $\Psi^{-1}\{\bullet\}$ does not exist, then the gains may be solved for by an iterative method, or by pre-computing $\Psi\{\bullet\}$ and using table look-up.

As described in WO 2006047600 and WO 2007120453, for perceptual domain dynamic equalization, the target specific loudness is related to the specific loudness by:

$$N_{des}[b,t] = \left(\frac{\bar{L}_p[b,t]}{EQ_{NORM}[b,t]}\right)^{1-\beta} \frac{EQ_{NORM}[b,t]}{\bar{L}_p[b,t]} N[b,t] \quad (12)$$

where $\beta$ is a user-specified parameter ranging from zero to one, indicating the degree of PDEQ processing that is to be applied to the audio signal. Note that $$\Psi\{G^2[b,t]E[b,t]\} = \left(\frac{\bar{L}_p[b,t]}{EQ_{NORM}[b,t]}\right)^{1-\beta} \frac{EQ_{NORM}[b,t]}{\bar{L}_p[b,t]} \Psi\{E[b,t]\} \quad (13)$$

from which the gains $G_p[b,t]$ may be determined.

From Eqn. 12, one notes that when $\beta=0$, $N_{des}[b,t] = N[b,t]$ for all bands $b$ and therefore the original signal is unmodified. When $\beta=1$, the scaling of the desired to actual specific loudness is equal to the ratio of the normalized desired specific loudness shape to the smoothed signal specific loudness spectrum, thereby transforming the smoothed spectral shape of the original audio signal completely to that of the desired shape $EQ[b]$, expressed in the perceptual domain. In such a case, $$\Psi\{G_p^2[b,t]E[b,t]\} = \frac{EQ_{NORM}[b,t]}{\bar{L}-p[b,t]} \Psi\{E[b,t]\}$$

from which the gains $G_p[b,t]$ may be determined.

Approximately Perceptual Domain Dynamic Equalization

While some embodiments of the invention are for perceptual domain dynamic equalization (PDEQ), as described above, aspects of the invention are applicable also to what we call approximate perceptual dynamic equalization, or simply dynamic equalization (DEQ) herein, in which a spectral loudness measure denoted $L[b,t]$ as a function of frequency band and time is an approximation to the specific loudness $L_p[b,t]$.

For this approximation, the measure of loudness, also called the signal spectrum, is taken to be $$L[b,t] = \sum_{k=0}^{N-1} |C_b[k]|^2 |X[k,t]|^2, \quad (14)$$

where again $C_b[k]$ are a selected set of bandpass filters that in one embodiment, are chosen to mimic the critical band filtering observed along the basilar membrane in the human ear at critical frequency $b$, and where $X[k,t]$, $k=0, 1, \ldots N-1$, are a set of STDFT (or MDCT) coefficients determined with an overlap window, as is known to those skilled in the art.

Comparing Eqn. 14 to Eqns. 2 and 3, the loudness measure L[b,t] is an approximation of the excitation E[b,t], the approximation being that the filter T[k] representing the frequency response of a filter simulating the transmission of audio through the outer and inner ear of a human has constant magnitude for all k. Furthermore, the loudness spectral measure L[b,t] can be considered an approximation to the specific loudness with the function $\Psi\{\cdot\}$ being the identity function such that $\Psi\{L[b,t]\}=L[b,t]$. Hence performing DEQ with such a loudness measure can be considered approximately perceptual DEQ.

For approximately perceptual DEQ, a set of time varying multi-band gains G[b,t] forming a time varying filter according to the relationship is applied according to the relationship:

$$\hat{L}[b,t]=G^2[b,t]L[b,t]. \quad (15)$$

is applied to the original signal spectrum L[b,t], resulting in a transformed spectral loudness measure denoted $\hat{L}$[b,t] whose spectral shape is closer to the desired shape denoted, as before, by EQ[b]. Eqn. 15 is analogous to Eqn. 9, the latter being for PDEQ.

In some embodiments, for DEQ, the filter gains G[b,t] are computed by comparing the spectral shape of the original signal L[b,t] to the desired shape EQ[b]. To prevent the filter G[b,t] from varying too fast over time and causing artifacts in the processed audio, the signal spectrum, i.e., the approximate loudness measure L[b,t] may first be smoothed across time in each band b using a smoothing coefficient denoted $\lambda$:

$$\overline{L}[b,t]=\lambda\overline{L}[b,t-1]+(1-\lambda)L[b,t]. \quad (16)$$

In alternate embodiments, different smoothing methods may be used.

As in the case, of PDEQ, for DEQ, to preserve the original dynamic range of the audio signal, the desired spectral shape EQ[b] may be normalized to have the same overall level as the smoothed signal spectrum $\overline{L}$[b,t]:

$$EQ_{NORM}[b,t] = \left( \frac{\sum_c \overline{L}[c,t]}{\sum_c EQ[c]} \right) EQ[b] \quad (17)$$

The filter $G^2$[b,t] is computed from the ratio of the normalized spectral shape $EQ_{NORM}$[b,t] and the smoothed signal spectrum $\overline{L}$[b,t]:

$$G^2[b,t] = \left( \frac{\overline{L}_p[b,t]}{EQ_{NORM}[b,t]} \right)^{1-\beta} \frac{EQ_{NORM}[b,t]}{\overline{L}_p[b,t]}, \quad (18)$$

where $\beta$ is a user-specified parameter ranging from zero to one, indicating the degree of DEQ processing that is to be applied to the audio. Analyzing Eqn. 18, one notes that when $\beta=0$, the filter G[b,t] equals one for all bands b and therefore the original signal is unmodified. When $\beta=1$, the filter is equal to the ratio of the normalized desired shape to the smoothed signal spectrum, thereby transforming the smoothed spectral shape of the original audio completely to that of the desired shape EQ[b].

An Audio Signal Processing Apparatus and Method

An apparatus that processes audio signals, such as a media device, is called an audio signal processing apparatus herein. Some embodiments of the invention are in the form of an audio signal processing apparatus that is stand-alone or part of a network such as a home entertainment network or other local network. In some embodiments, the audio signal processing apparatus or the home network of which the audio signal processing apparatus is part in some embodiments is in communication with a serving processing system—a server—via a network, which typically but not necessarily is the Internet. The processing system in such a server network configuration is a client to the server.

Figure 2A:
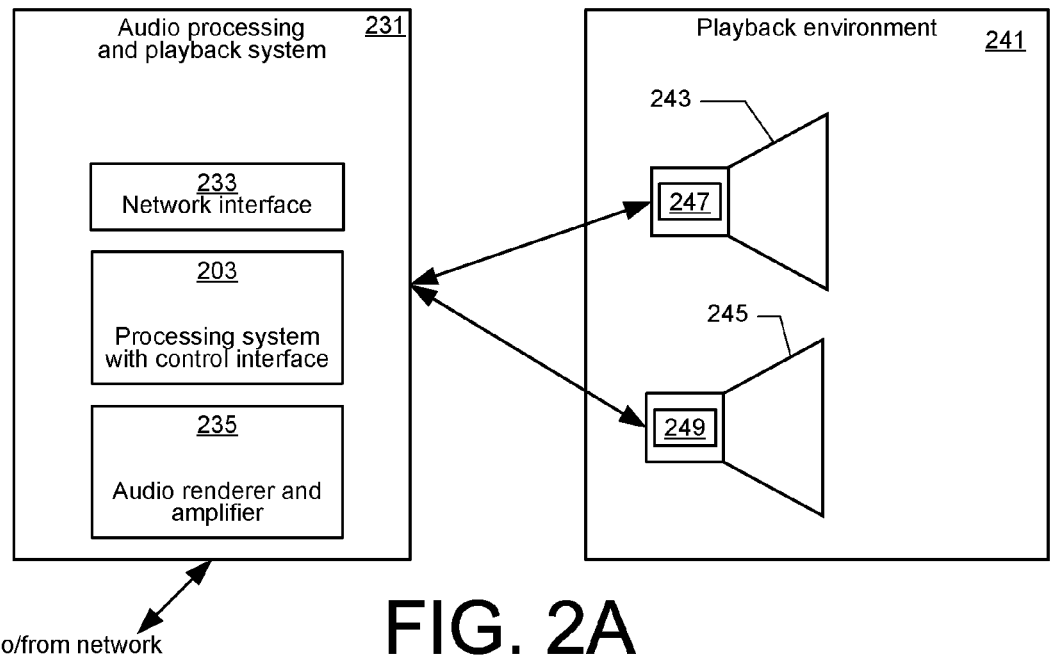
FIGS. 2A and 2B each shows a simplified block diagram of an embodiment in the form of a processing system apparatus for selecting and using a predefined DEQ spectral profile in order to process an audio signal.
Figure 2B:
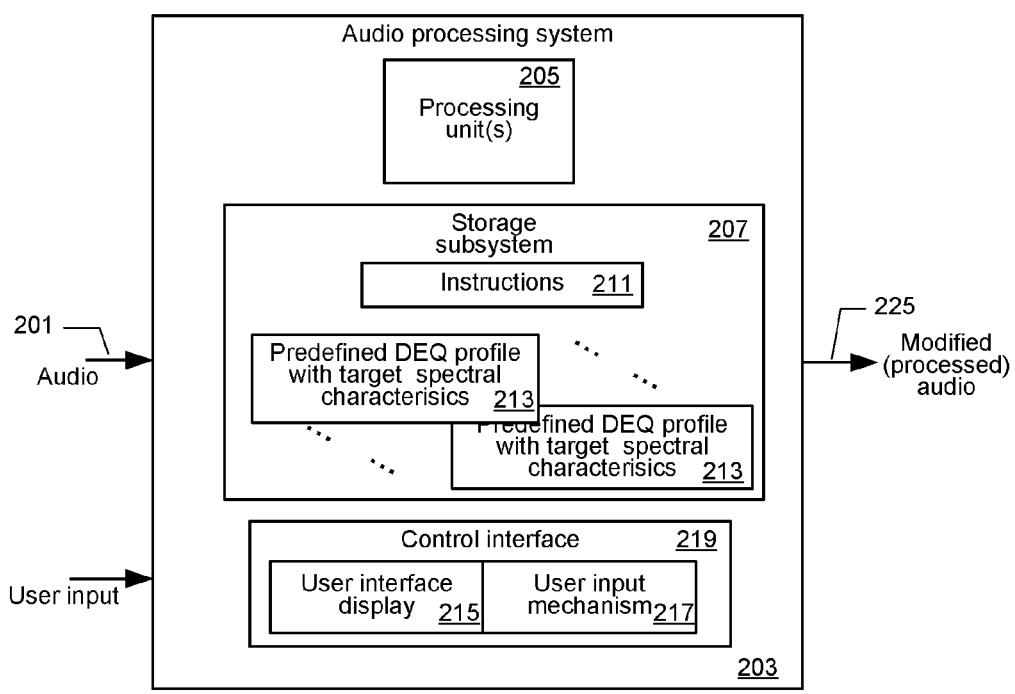

FIGS. 2A and 2B each shows a simplified block diagram of an embodiment in the form of a processing system apparatus 203 for selecting and using a predefined DEQ spectral profile in order to process an audio signal. The processing system apparatus 203 is for processing audio 201 to generate audio output 225 that has been modified by DEQ or PDEQ as specified in accordance to one or more features of the present invention. The apparatus, for example, can implement PDEQ processing such as described by Eqns. 1 to 13, or DEQ processing such as described by Eqns. 14 to 18. FIG. 2A shows the processing system apparatus 203 as part of an audio processing and playback system 231 that includes the audio processing system 203 that accepts an audio signal 201 and generates a processed audio signal 225. The audio processing and playback system 231 also includes an audio renderer and amplifier 235 that is configured to accept the processed audio signal 225 and render and amplify the signal, e.g., to produce at least two loudspeaker signals for playback through audio loudspeakers in a playback environment 241, e.g., a room, a car, etc., that has some playback environment characteristics. Two loudspeaker signals are shown with two loudspeakers 243 and 245 in the playback environment 241 as would be the case for stereo listening. In general, any number of loudspeaker signals and loudspeaker are possible. As one example, headphones include two loudspeakers, one next to each ear of a listener. As another example, surround sound includes four or five or more loudspeakers.

Such an apparatus may be included, for example, in a media device for playback of audio media. The audio input 201 and the audio output 225 are assumed to be in the form of sampled data. In the case of analog input, a digitizer including an analog to digital converter and quantizer would be present. For audio playback, a de-quantizer and a digital-to-analog converter would be present. Such and other elements that might be included in a complete audio processing system, e.g., media device are left out, and how to include such elements would be clear to one skilled in the art.

The audio renderer, amplifier and loudspeakers are components of the playback reproduction apparatus used in the playback environment 241.

In some embodiments, the audio playback and processing system 231 includes a network interface 233, and is coupled to a network.

FIG. 2B shows one embodiment of the audio processing system 203 in processing and playback apparatus 231. The processing system 203 includes at least one processing unit (processors) 205, which can be the processing units of a digital signal processing device, or a CPU of a more general purpose processing device. The one or more processors 205 are configured in operation to process the audio signal 201 according to a selected predefined dynamic equalization (DEQ) spectral profile to generate the processed audio signal 225 using DEQ or PDEQ. The processing is as described above, and includes determining a spectral measure that is modified to dynamically adjust the time-varying spectral profile of the audio signal 201 to more closely match a time invariant spectral profile according to the selected predefined DEQ spectral profile. The processed audio signal 225 being for playback in a reproduction environment, e.g., environment 241 using a reproduction apparatus, e.g., the reproduction apparatus 235, 243, and 245.

The selected predefined DEQ spectral profile includes one or more of:

A device-specific DEQ spectral profile to equalize for one or more characteristics of the reproduction apparatus, or one or more characteristics of the reproduction environment, or characteristics of both the reproduction environment and the reproduction apparatus, A content-specific DEQ spectral profile to equalize according to the content or type of content represented by the audio signal, and An equalization-type specific DEQ spectral profile to equalize according to a type of equalization effect.

These predefined DEQ spectral profiles are described in more detail later in the description.

The processing system 203 includes a storage subsystem 207 coupled to the one or more processors 205. The storage subsystem 207 includes memory and may include one or more other storage elements. The storage subsystem 207 is configured with instructions 211, e.g., stores instructions 211 that when executed cause carrying of a method of operating the audio signal processing apparatus 203 to process the audio signal 201 to produce the processed audio signal 225.

The elements of the processing system 203 are coupled, e.g., by a bus subsystem or some other interconnection mechanism not shown in FIG. 2B. Some of the elements of processing system 203 may be integrated into a single circuit, using techniques commonly known to those skilled in the art.

As described further in this description, in some embodiments, the loudspeakers and/or other components of the reproduction apparatus include identifying information, shown in loudspeakers 243 and 245 as identifying information 247 and 249, respectively. In some embodiments of the invention, the audio signal processing system 203 is configured, e.g., by including instructions as part of the instructions 211, to obtain such identifying information, and use the identifying information to automatically select a device-specific DEQ spectral profile based on the identifying information.

Figure 3:
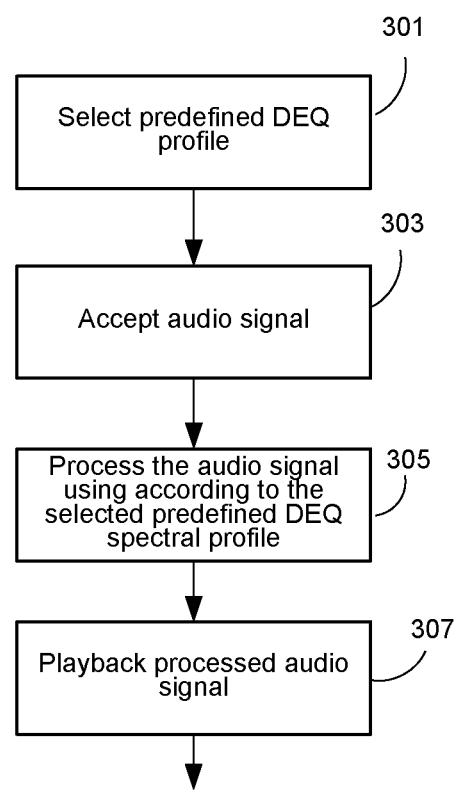
FIG. 3 shows a simplified flowchart of an embodiment of a method of operating an audio signal processing apparatus such as apparatus to process an audio signal using DEQ according to a selected predefined DEQ spectral profile.

FIG. 3 shows a simplified flow chart of an embodiment of a method of operating an audio signal processing apparatus such as processing and playback apparatus 231 to process an audio signal such as signal 201. The method includes in 303 accepting an audio signal, and in 305 processing the audio signal using the audio signal processing apparatus according to a selected predefined DEQ spectral profile to generate a processed audio signal. The processing including determining a spectral measure that is modified to dynamically adjust the time-varying spectral profile of the audio signal to more closely match a time invariant spectral profile according to the selected predefined DEQ spectral profile. The result is a processed audio signal for playback in a reproduction environment using a reproduction apparatus. As above, the selected predefined DEQ spectral profile includes one or more of a device-specific DEQ spectral profile, a content-specific DEQ spectral profile, and/an equalization-type specific DEQ spectral profile. These predefined DEQ spectral profiles are described in more detail later in the description.

In some embodiments, the processing according to the selected predefined DEQ spectral profile includes perceptual domain dynamic equalization, e.g., as described by Eqns. 1 to 13 to dynamically adjust the time-varying perceived spectrum of the audio signal to more closely match the time invariant spectral profile according to the selected predefined DEQ spectral profile.

In some other embodiments, the processing according to the selected predefined DEQ spectral profile includes approximate perpetual domain dynamic equalization, e.g., as described by Eqns. 14 to 18 herein above to dynamically adjust the time-varying perceived spectrum of the audio signal to more closely match the time invariant spectral profile according to the selected predefined DEQ spectral profile.

In some embodiments, the method includes playing back the processed audio signal in the reproduction environment using the reproduction apparatus.

In some embodiments, the method includes in 301 selecting the selected predefined DEQ profile.

Referring back to FIG. 2B, in some embodiments, the storage subsystem 207 is configured with a set of one or more predefined DEQ profiles with respective target spectral characteristics. The selected predefined DEQ profile is one of the stored set of predefined DEQ profiles. In some embodiments, the one or more processors 205 are configured, e.g., by including instructions in 211 to automatically select the selected predefined DEQ spectral profile according to one or more characteristics of the reproduction apparatus. The selecting of the method in such embodiments includes automatically selecting the selected predefined DEQ spectral profile according to one or more characteristics of the reproduction apparatus.

Some embodiments of the processing system 203 and the apparatus 231 include a control interface 219 configured to accept user input of a selected one of the stored set of predefined DEQ spectral profiles. One such control interface includes a user interface display 215 and a user input mechanism 217. The term "control interface" is used herein for describing the combination of the visual or tactile presentation to a user of one or more control elements configured to accept a user input via one or more input mechanisms 217. The control elements thus can be manipulated via respective input mechanisms. The term "input mechanism" of course should not be taken to only suggest only physical mechanical control, but also to include any agency or means by which input is provided by a user. Thus, the control element may include "virtual" controls such as virtual knobs, sliders, touch pads, and so forth, that include a display and some manner of accepting user input (the input mechanism) to manipulate the virtual control(s). Thus, in some embodiments, the control interface includes a user interface of one or more control elements displayed on a display device (the user interface display 215), and a user input method or device or subsystem for accepting user input of one or more of the displayed control elements. In other embodiments, the control interface includes physical control elements that can be manipulated by the user to provide the user input, e.g., one or more knobs, one or more slide controls, and/or one or more two dimensional controls such as a touch pad configured to accept a user indication of a location on the touch pad.

In such an embodiment that includes the control interface 219, the selecting includes accepting user input from the control interface 219 included in the audio signal processing apparatus 231. In some embodiments, the method includes presenting the control interface 219 to the user. Such control interface 219 includes one or more control elements.

A Pdeq Processing Example

Figure 4A:
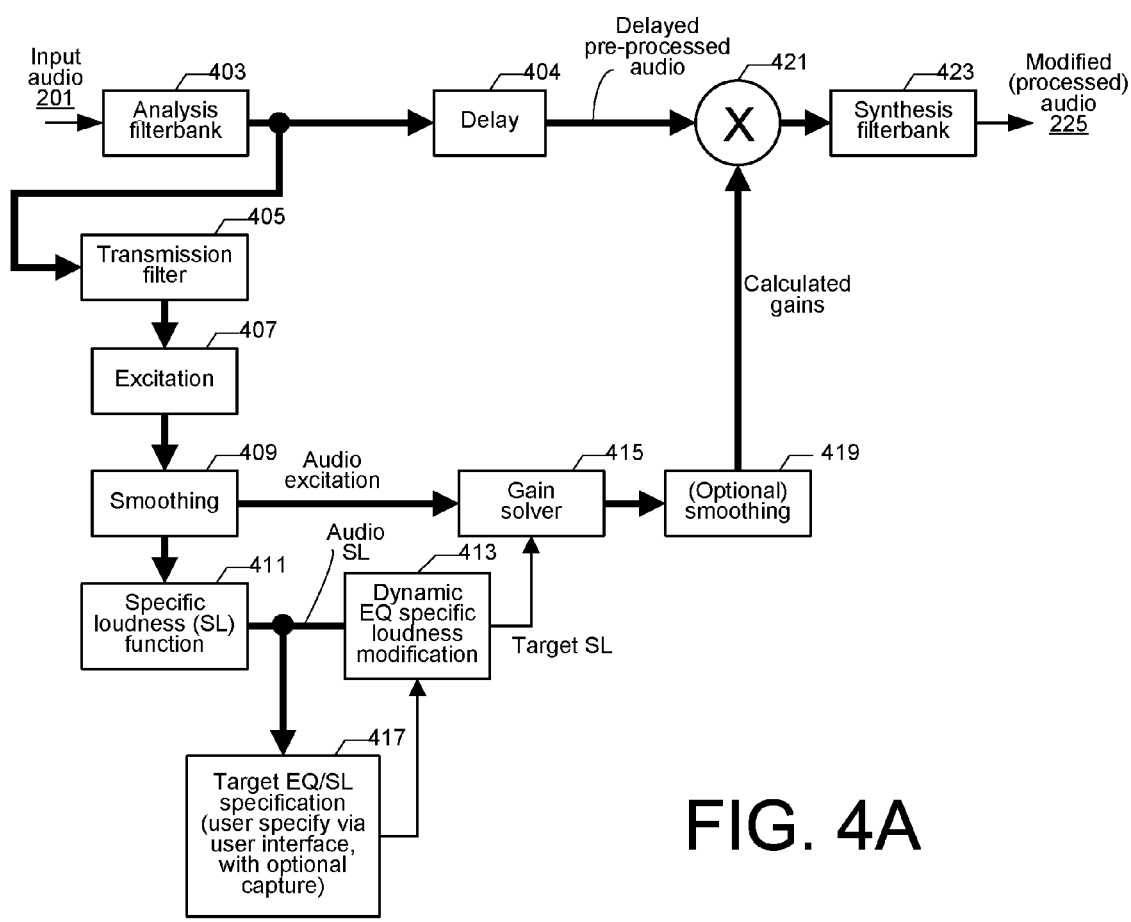
FIG. 4A shows a simplified block diagram of a feed-forward embodiment of perceptual domain dynamic equalization signal processing apparatus in which pre-processing separates an input audio signal into frequency bands.

While some embodiments of an audio signal processing apparatus include one or more processors and a storage subsystem that has instructions stored there as shown in FIG. 2B, other arrangements also are possible within the scope of the invention. FIG. 4A shows a simplified block diagram of a feed-forward embodiment of a PDEQ apparatus in which pre-processing separates an input audio signal into frequency bands. Some embodiments include a control interface with one or more control elements configured to accept a user input for specifying the equalization, as described in more detail herein.

In practical embodiments, the processing of the audio is carried out in the digital domain, so that sampling and digitizing of analog signals is carried out. Such details are left out of this description, and would be clear to those skilled in the art. At least some of the elements of the block diagram of FIG. 4A may be implemented by a processing system that includes at least one processor, such as shown in FIG. 2B. The apparatus of FIG. 4A also may be implemented with some of the blocks having dedicated hardware elements.

An apparatus such as shown in FIG. 4A may be included, for example, in a media device or some other audio device for playing back audio.

The arrangement shown in FIG. 4A is used to carry out PDEQ as described above, e.g., in Eqns. 1 through 13, with the addition of a control interface including a control interface with one or more control elements configured to accept a user input for specifying the equalization.

The audio 201 first passes through an analysis filterbank function or device 403, which splits the audio signal into a plurality of frequency bands denoted by frequency index b. Thick lines in FIG. 4A indicate multiple signals, so that there are multiple outputs, each a frequency band b from analysis filterbank 403. Each of these frequency bands undergoes the processing steps shown in FIG. 4A, up to a synthesis filterbank 423, which sums the bands to a combined wideband signal to generate the processed audio signal 225.

The response of the filter associated with each frequency band in the analysis filterbank 403 is designed to simulate the response at a particular location of the basilar membrane in the inner ear of a human. In some embodiments, analysis filterbank 403 includes a set of linear filters whose bandwidth and spacing are constant on the equivalent rectangular bandwidth (ERB) frequency scale. See FIG. 1.

Analysis filterbank 403 may be implemented efficiently through use of the forward and/or inverse short-time discrete Fourier transform (short-time DFT, STDFT) or the forward and/or inverse modified discrete cosine transform (modified DCT, MDCT). The forward and/or inverse STDFT or MDCT may be used similarly to implement synthesis filterbank 423.

The output of each filter in the analysis filterbank 403 next passes into a transmission filter function or device 405 that is designed to simulate the filtering effect of the transmission of audio through the outer and middle ear of a human.

In order to compute the loudness of the input audio signal, a measure of the audio signals' short-time energy in each filter of the analysis filterbank 403 after application of the transmission filter 405 is obtained. This time and frequency varying measure is referred to as the excitation, denoted E[b,t], where b denotes the frequency band, and t is an index denoting blocks of time. To obtain the excitation, the outputs of transmission filter 405 are accepted by an excitation function or device 407, the outputs of which are designed to simulate the distribution of energy along the basilar membrane of a human ear. Depending on the desired effects, the excitation energy values may be smoothed across time by a smoothing function or device 409 that are configured to have time constants set in accordance with the requirements of the desired effects of the processing. The output of excitation function 407 is a frequency domain representation of energy denoted E in respective ERB bands denoted b per time denoted t.

A specific loudness function or device 411 converts the smoothed excitation signals into specific loudness (SL). Specific loudness may be represented, e.g., in units of sone per unit frequency, e.g., sone per ERB. Note that from the specific loudness, the overall or total loudness is the sum of the specific loudness across all bands b. Designing the specific loudness function 411 includes determining gains for narrowband and wideband estimated values chosen to match experimental data on the growth of loudness for tones and noise. Furthermore, the specific loudness function 411 is designed such that the specific loudness is some small value instead of zero when the excitation is at the threshold of hearing, and such that the specific loudness decreases monotonically to zero as the excitation decreases to zero.

The specific loudness components associated with the frequency bands are passed into a dynamic equalization specific loudness modification function or device 413 that generates a target specific loudness. In the case of perceptual domain dynamic equalization (PDEQ), a target specific loudness may be calculated using a relationship that takes into account the current spectrum of the audio, in particular, the spectrum of the signal is measured and the signal is then dynamically modified in order to transform the measured spectrum into an essentially static desired shape, specified across bands b and referred to as EQ[b]. The spectral shape of the audio signal is denoted by L[b,t], and in one embodiment, is determined as a smoothing of the specific loudness, denoted N[b,t] across time. One may not want the PDEQ modification to vary drastically from one band to the next, and therefore a band-smoothing function may be applied to generate a band-smoothed spectrum. In order to preserve the original dynamic range of the audio, the desired spectrum EQ[b] may be normalized to have the same overall loudness as the measured spectral shape given by L[b,t].

In embodiments described herein a target EQ specification function or device 417 is used to provide a control interface to a user in order for the user to specify one or more parameters for the dynamic equalization using one or more respective control elements. In particular, the target EQ specification function or device 417 in some embodiments includes a device for selecting a predefined DEQ spectral profile. Such selecting may be automatic, or may be manual via a control interface as described in more details elsewhere herein. The predefined DEQ spectral profile may also be served over a network by a server processing system, as described elsewhere herein. The EQ specifier 417 in some embodiments may include a capture function by which the specific loudness of some audio that has desired properties is captured, e.g., from the specific loudness block 411 while the input 201 is audio with desired characteristics. This provides the desired characteristics EQ[b], which may be stored. In the case there is one EQ[b], the user specified parameter is denoted $\beta$ as in Eqn. 12 and is a parameter that varies from 0 to 1 that expresses the amount of PDEQ that is to be applied, with a value 0 indicating no PDEQ.

Taking as its inputs the smoothed excitation frequency band components from smoother 409 and the target specific loudness from the SL modification 413, a gain solver function or device 415 is configured to determine the gains that needs to be applied to each band b in order to transform the determined specific loudness N[b,t] into the target specific loudness $N_{des}$[b,t]. The gains determined are in general frequency- and time-varying gains, which, when applied to the original excitation, result in a specific loudness that, ideally, is equal to the desired target specific loudness, and in practice results in modifying the audio signal in order to reduce the difference between its specific loudness and the target specific loudness. The gain solver 415 may be implemented in various ways. If a closed form calculations is possible, it is applied. If a table lookup is possible, such a method also may be used. In one embodiment, the gain solver may include an iterative process in which, for each iteration, a specific loudness is evaluated using a current estimate of the gains. Other methods for computing the modification parameters through either explicit or implicit computation of the specific loudness and target specific loudness may be devised, and this invention is intended to cover all such methods.

The gains per band generated by the gain solver 415 may be smoothed further over time by optional smoothing function or device 419 in order to minimize perceptual artifacts. It may alternately be advantageous that temporal smoothing be applied elsewhere in the overall process or device.

Finally, the gains determined by gain solver 415 are applied to respective bands through a respective multiplicative combining function or combiner 421 that applies the gains to the outputs from the analysis filterbank delayed by a suitable delay function or device 404 configured to compensate for any latency associated with the gain computation.

The processed audio 225 is synthesized from the gain-modified bands in a synthesis filterbank function or device 423. As described above, analysis filterbank 403 may be implemented efficiently through use of the short-time DFT or the modified DCT, and the STDFT or MDCT may be used similarly to implement synthesis filterbank 423. The synthesis filters for the bands are determined from the filters used in analysis filterbank 403 and the delay of delay 404.

Note that alternatively, instead of calculating gains for use in applying gain modifications in frequency bands, the gain solver 415 may calculate filter coefficients that control a time-varying filter, such as a multi-tapped FIR filter or a multi-pole IIR filter. For simplicity in exposition, aspects of the invention are mainly described as employing gain factors applied to frequency bands, it being understood that filter coefficients and time-varying filters may also be used in practical embodiments.

An Apparatus Carrying out Approximate Perceptual Deq

Figure 4B:
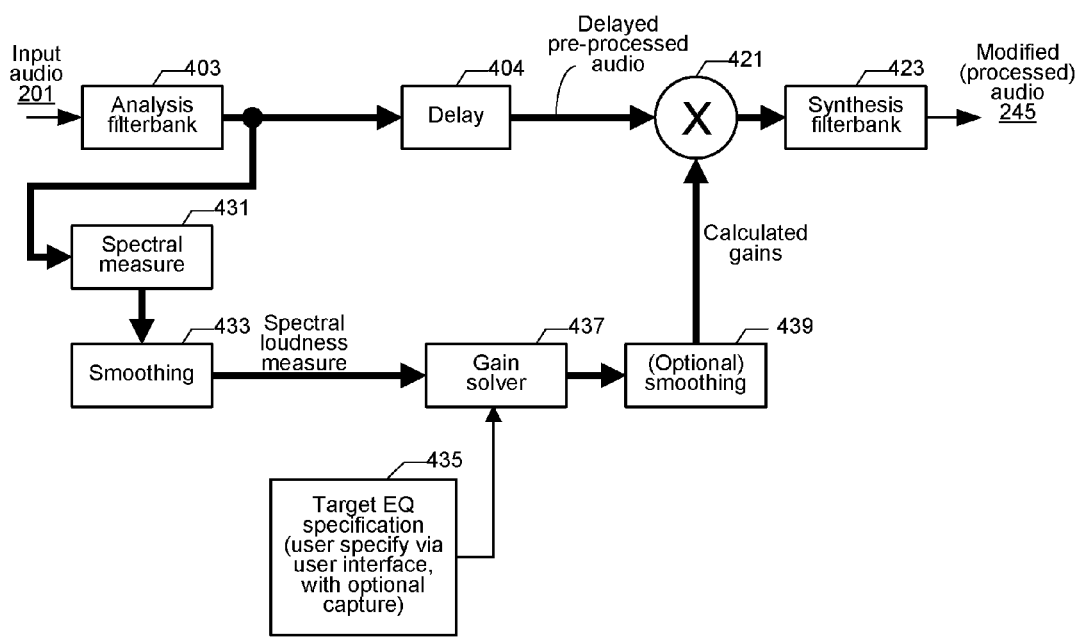
FIG. 4B shows a simplified block diagram of a feed-forward embodiment of a dynamic equalization signal processing apparatus.

FIG. 4B shows a simplified block diagram of a feed-forward embodiment of a DEQ apparatus in which pre-processing separates an input audio signal into frequency bands. The arrangement shown in FIG. 4B is used to carry out DEQ as described above, e.g., in Eqns. 14 through 18. Some embodiments include a control interface with one or more control elements configured to accept a user input for specifying the equalization, as described in more detail herein.

In practical embodiments, the processing of the audio is carried out in the digital domain, so that sampling and digitizing of analog signals is carried out. Such details are left out of this description, and would be clear to those skilled in the art. At least some of the elements of the block diagram of FIG. 4B may be implemented by a processing system that includes at least one processor, such as shown in FIG. 2B. The apparatus of FIG. 4B also may be implemented with some of the blocks having dedicated hardware elements.

As in the case of FIG. 4A, the apparatus of FIG. 4B may be included, for example, in a media device or some other audio device for playing back audio.

The input audio 201 first passes through an analysis filterbank function or device 403, which splits the audio signal into a plurality of frequency bands denoted by frequency index b. Thick lines in FIG. 4B indicate multiple signals, so that there are multiple outputs, each a frequency band b from analysis filterbank 403. Each of these frequency bands undergoes the processing steps shown in FIG. 4B, up to a synthesis filterbank 423, which sums the bands to a combined wideband signal to generate the processed audio signal 245. Analysis filterbank 403 and synthesis filterbank 423 in FIG. 4B can be substantially as in FIG. 4A.

The output of each filter in the analysis filterbank 403 is used to determine in spectral measure determiner 431 the spectral measure of loudness, denoted L[b,t], where b denotes the frequency band, and t is an index denoting blocks of time. The spectral measure determiner 431 is in one embodiment substantially the same as element 407 of FIG. 4A. Depending on the desired effects, the spectral measure L[b,t] energy values may be smoothed across time by a smoothing function or device 433 that is configured to have time constants set in accordance with the requirements of the desired effects of the processing.

The smoother loudness measure from smoothing device 433 and an essentially static desired spectral shape, specified across bands b and referred to as EQ[b] and used to generate a set of gains by a gain solver 437 as described in above in Eqns. 17 and 18.

In embodiments described herein a target EQ specification function or device 435 is used to provide a control interface to a user in order for the user to specify one or more parameters for the dynamic equalization using one or more respective control elements. In particular, the target EQ specification function or device 435 in some embodiments includes a device for selecting a predefined DEQ spectral profile. Such selecting may be automatic, or may be manual via a control interface as described in more details elsewhere herein. The predefined DEQ spectral profile may also be served over a network by a server processing system, as described elsewhere herein. The EQ specifier 435 in some embodiments may include a capture function by which the spectral content L of some audio that has desired properties is captured, e.g., from the spectral measure block 431 or smoothing block 433 while the input 201 is audio with desired characteristics. This provides the desired characteristics EQ[b], which may be stored. In the case there is one EQ[b], the user specified parameter is denoted $\beta$ as in Eqn. 18 and is a parameter that varies from 0 to 1 that expresses the amount of DEQ that is to be applied, with a value 0 indicating no DEQ.

The gains determined are in general frequency-varying and time-varying gains, which, when applied to the spectral measure, result in a spectral measure that, ideally, is equal to the desired target spectral measure EQ[b], and in practice results in modifying the audio signal in order to reduce the difference between the spectral measure of the signal and the target spectral measure EQ[b]. The gain solver 437 may be implemented in various ways.

The gains per band generated by the gain solver 437 may be smoothed further over time by optional smoothing function or device 439 in order to minimize perceptual artifacts. It may alternately be advantageous that temporal smoothing be applied elsewhere in the overall process or device.

Finally, the gains determined by gain solver 437 are applied to respective bands through a respective multiplicative combining function or combiner 421 that applies the gains to the outputs from the analysis filterbank delayed by a suitable delay function or device 404 configured to compensate for any latency associated with the gain computation.

The processed audio 245 is synthesized from the gain-modified bands in a synthesis filterbank function or device 423. The synthesis filters for the bands are determined from the filters used in analysis filterbank 403 and the delay time of delay 404, and otherwise are as described with reference to FIG. 4A.

Note that alternatively, instead of calculating gains for use in applying gain modifications in frequency bands, the gain solver 437 may calculate filter coefficients that control a time-varying filter, such as a multi-tapped FIR filter or a multi-pole IIR filter. For simplicity in exposition, aspects of the invention are mainly described as employing gain factors applied to frequency bands, it being understood that filter coefficients and time-varying filters may also be used in practical embodiments.

A Client Server System, with a Server for Predefined Deq Profiles

Figure 5:
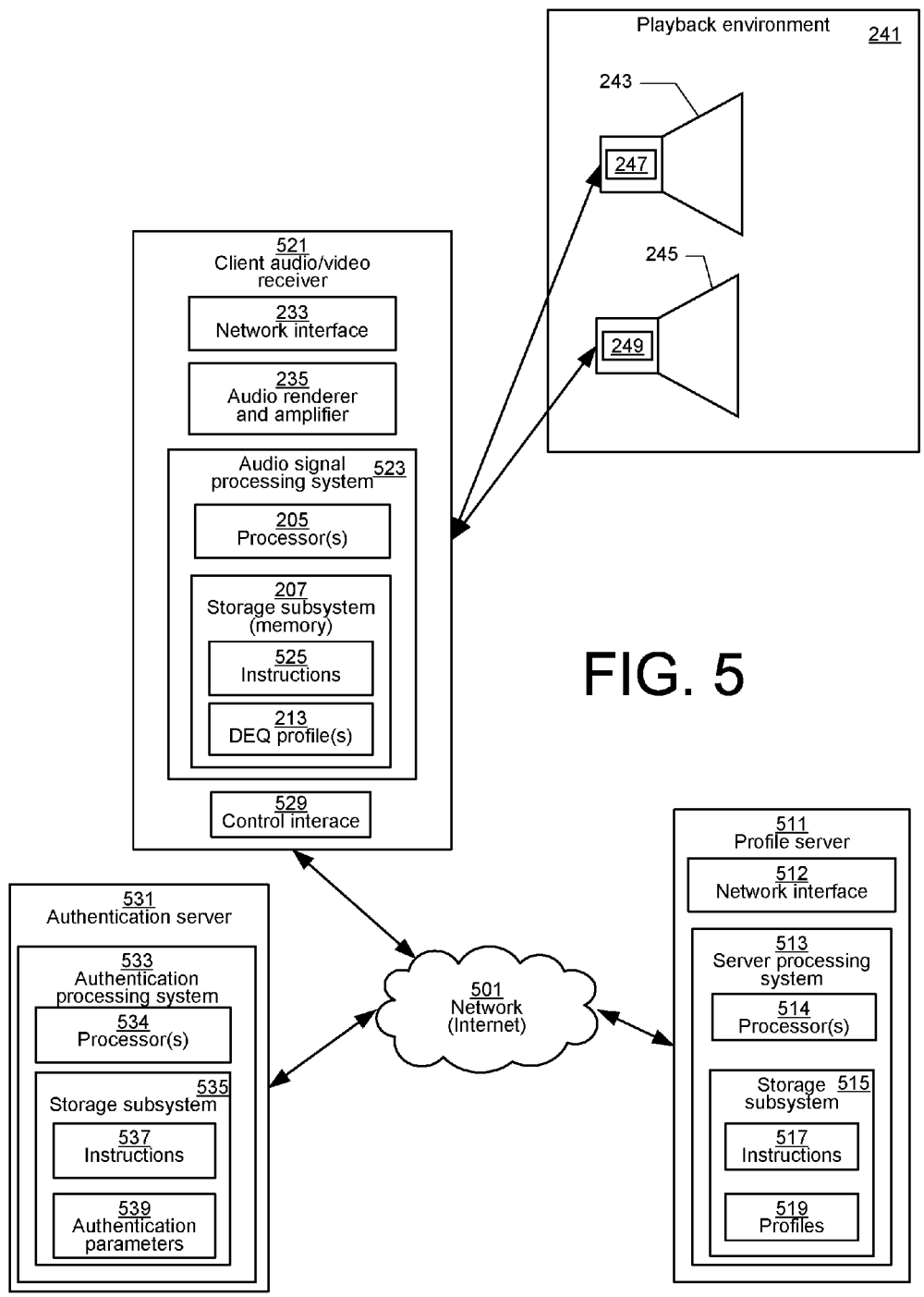
FIG. 5 shows an example network, which in some embodiments, the Internet, and in other embodiments, a different network, that includes an audio processing apparatus and a profile server, the audio processing apparatus and/or the profile server including one or more aspects of the present invention.

Some embodiments include a server that distributes predefined profiles for use by audio signal processing apparatuses for different applications and situations. FIG. 5 shows an example network 501, which in some embodiments, is the Internet, and in other embodiments, is a different network. A profile server 511 and one client audio/video receiver are shown coupled to the network. In general, there would be several client devices that at one time or another are coupled to the server via the network 501 in order to obtain one or more predefined profiles from the profile server 511. One embodiment of the client audio/video receiver 521 includes a network interface 233, an audio signal processing system 523, a control interface 529, and an audio renderer and amplifier subsystem 235 for playback of audio content. The client audio/video receiver is coupled to one or more loudspeakers. In this example embodiment, two loudspeakers 243 and 245 are shown and are placed in a listening environment 241, as in FIG. 2A.

The audio processing system 523 is substantially the same as that shown in FIGS. 2A and 2B, except that in the embodiment of FIG. 5, an included control interface 529 is not part of the audio processing system 523, but is coupled thereto. Some elements of the audio signal processing system thus are shown with reference numerals that are not the same as that of FIG. 2B.

The profile server 511 includes a server processing system 513 and is coupled to the network via a network interface 512 such that the server processing system 513 can communicate in operation with one or more audio signal processing apparatuses that are coupled to the network 501, e.g., the client audio/video receiver 521. The server processing system 513 includes one or more processors 514 and a storage subsystem that typically includes memory and one or more other storage elements such as hard disks and/or optical storage devices. The storage subsystem includes instructions 517 that when executed carry out a DEQ spectral profile serving process described in more detail herein below.

Note that while the storage subsystem is shown in the server processing system 513, by the server processing system "includes" a storage subsystem also covers the case that some of the storage of the storage subsystem 515 is coupled to the processors 514 via a network, e.g., the network 501 or some other network. Such network storage arrangements are common, and the term "the processing system includes a storage subsystem" is meant to include such cases of all or some of the storage being coupled via a network.

The storage subsystem stores a set of predefined dynamic equalization (DEQ) spectral profiles 519.

The one or more processors are arranged in operation to send one or more of the set of stored predefined DEQ spectral profiles 519 to at least one signal processing apparatus coupled to the network, e.g., system 523 in device 521 such that a particular signal processing apparatus, e.g., system 523 as a result of receiving a selected predefined DEQ spectral profile, is able to process an accepted audio signal according to the selected predefined DEQ spectral profile to generate a processed audio signal for playback. The sending to at least one signal processing apparatus is either directly via the network or indirectly via a different processing system. In one version, as described below, the server processing system 513 is used to create predefined DEQ spectral profiles, and to send the spectral profiles to a different processing system. Such other different processing system sends one or more particular predefined DEQ profiles to at least one audio signal processing system.

The processing by the audio signal processing system 523 includes determining a spectral measure that is modified to dynamically adjust the time-varying spectral profile of the audio signal to more closely match a time invariant spectral profile according to the selected predefined DEQ spectral profile. The processed audio signal is for playback in a reproduction environment using a reproduction apparatus. In the example shown, the processed audio signal is for playback via the audio renderer and amplifier 235 via loudspeakers 243 and 245 in the playback environment 241.

In one embodiment, the stored predefined DEQ spectral profiles include one or more of the following types of DEQ spectral profiles.

A device-specific DEQ spectral profile to equalize for one or more characteristics of a reproduction apparatus, or one or more characteristics of a reproduction environment in which the reproduction apparatus, or characteristics of both the reproduction environment and the reproduction apparatus.

A content-specific DEQ spectral profile to equalize according to the content or type of content represented by the audio signal to be processed.

An equalization-type specific DEQ spectral profile to equalize according to a type of equalization effect.

One aspect of the invention is a method of operating processing system such as the server processing system 513 of the profile server 511 for providing predefined DEQ spectral profiles for use by client processing systems such as system 523. The method includes storing a set of predefined DEQ spectral profiles in the storage subsystem 515 that is part of or coupled to the server processing system 513. The method further includes distributing one or more of the stored predefined DEQ spectral profiles 519 to one or more signal processing apparatuses coupled to the network 501, e.g., the audio signal processing system 523 in client audio/video receiver 521 such a particular signal processing apparatus coupled to the network, as a result of receiving a selected predefined DEQ spectral profile, can process an accepted audio signal according to the selected predefined DEQ spectral profile to generate a processed audio signal. The processing is as described above, e.g., includes determining a spectral measure that is modified to dynamically adjust the time-varying spectral profile of the audio signal to more closely match a time invariant spectral profile according to the selected predefined DEQ spectral profile, the processed audio signal being for playback in a reproduction environment using a reproduction apparatus.

In some embodiments, the storage subsystem is configured with instructions 517, e.g., stores instructions 517 that when executed by one or more of the processor 514 causes carrying out of the method.

In one embodiment, the one or more processors are configured, in operation, e.g., by instructions being included in instructions 517 that when executed cause the server processing system to receive a request from the particular signal processing apparatus, e.g., audio signal processing system 523 coupled to the network 501 for the selected predefined DEQ spectral profile. In response to the request, the one or more processors are configured, in operation, e.g., by instructions being included in instructions 517 that when executed cause the server processing system to send to the particular signal processing apparatus, e.g., to system 523 the selected predefined DEQ spectral profile, such that the signal processing apparatus, as a result of receiving the selected predefined DEQ spectral profile, processes the accepted audio signal according to the selected predefined DEQ spectral profile to generate the processed audio signal.

In some embodiments, the request is an indirect request provided by a network entity other than the requesting particular signal processing apparatus, such that the selected predefined DEQ spectral profile is provided to the requesting particular signal processing apparatus indirectly via the network entity.

Thus, in some embodiments, the method of operating the server processing system includes receiving a request from the particular signal processing apparatus coupled to the network for the selected predefined DEQ spectral profile, and sending to the particular signal processing apparatus, in response to the request, the selected predefined DEQ spectral profile. The signal processing apparatus, as a result of receiving the selected predefined DEQ spectral profile, processes the accepted audio signal according to the selected predefined DEQ spectral profile to generate the processed audio signal.

As for the audio signal processing apparatus, e.g., the client audio/video receiver 521 that includes audio processing system 523, the method of operating the apparatus includes sending a request to the server processing system in profile server 511 for a particular predefined DEQ spectral profile, and receiving the requested particular predefined DEQ spectral profile to be used as the selected predefined DEQ profile for processing an audio signal.

The one or more processors of the audio signal processing apparatus, e.g., the at least one processor 205 of client audio/video receiver 521 for some embodiments that include the network interface 233 are in operation to retrieve at least a particular predefined DEQ spectral profile from the server processing system 513 coupled to the network 501, e.g., the processing system in profile server 511 that includes or is coupled to the server storage subsystem 515 in which a server set of predefined DEQ spectral profiles 519 is stored. The retrieving includes sending a request to the server processing system 513 for the particular predefined DEQ spectral profile; and receiving the requested particular predefined DEQ spectral profile from the profile server 511.

One implementation of the method of operating the audio processing system 523 of the client audio/video receiver 521 is carried out by including instructions in the instructions 525 of the storage subsystem 207 that when executed cause the method steps described above of sending a request to the profile server 511 and receiving in response the requested particular predefined spectral profile to use as the selected DEQ spectral profile for processing.

Predefined Deq Spectral Profiles

The Applicant recognizes that there is value in using and distributing predefined DEQ spectral profiles that include at least one of a device-specific DEQ spectral profile, a content-specific DEQ spectral profile, and an equalization-type specific DEQ spectral profile.

Examples of such profiles and uses thereof are now discussed in more detail.

Device-specific and Environment-specific Deq Spectral Profiles

A device specific DEQ spectral profile is usable to equalize for one or more characteristics of a reproduction apparatus. A device specific DEQ spectral profile in addition, or instead is usable to equalize for one or more characteristics of a reproduction environment in which the reproduction apparatus is in operation.

A manufacturer of a particular device, e.g., of an amplifier, or of loud speakers, for example can create or have created a predefined DEQ spectral profile, or a set of such predefined DEQ spectral profiles for distribution so that an input signal can be dynamically compensated for the particular characteristics of the particular device. A third party also can create a service of producing predefined DEQ spectral profiles for particular devices that are commercially available. In some embodiments, the manufacturer of the device pre-loads into the device a device-specific predefined DEQ spectral profile. In other embodiments, in the case of the audio signal processing apparatus being connected to a profile server, the signal processing apparatus requests and obtains from the profile server, a particular device-specific predefined DEQ spectral profile to take into account the characteristics of the preproduction apparatus being used.

There is also benefit in producing and distributing different predefined DEQ spectral profiles aimed at different classifications of reproduction apparatuses. Thus, a predefined DEQ spectral profile includes a device-specific DEQ spectral profile that takes into account a classification of the reproduction apparatus being used. In this manner a small number of predefined profiles can be used for a relatively large number of devices that fall into one or another classification. As an example, in one version, the reproduction apparatus classification is one of a set of reproduction apparatus classifications includes at least one of an amplifier type and a loudspeaker type. As an example of loudspeaker types, the reproduction apparatus classification includes one or more of a small headphone reproduction apparatus, a small loudspeaker reproduction apparatus, and a full bass response speaker reproduction apparatus. A listener can set the type of apparatus and select, or in the case of being connected to a server, request and obtain from the profile server, a particular device-type predefined DEQ spectral profile to take into account the type of loudspeakers being used.

It is known that the spectral characteristics of some components change over time. For example, the material from which loudspeaker cones are made changes over time, so that the spectral characteristics of a loudspeaker changes over time. In some embodiments, the selected predefined DEQ spectral profile to use for processing includes a device-specific predefined DEQ spectral profile that takes into account the age of one or more components of the reproduction apparatus. A third party or a loudspeaker manufacturer can publish age-dependent predefined DEQ spectral profiles for specific loudspeakers, or for types of loudspeakers.

Modern equipment often includes mechanisms for automatic identification of the equipment. Such automatic identification typically includes information stored in the equipment. As a simple and non-limiting example, the loudspeakers 243 and 245 of FIG. 2A and FIG. 5 are shown to include identifying information 247 and 249, respectively. The coupling between the loudspeakers and the playback audio renderer and amplifier is bidirectional to provide for the audio signal processing system to retrieve the identifying information. The identifying information is sufficient to identify one or more characteristics of the loudspeaker. Such identifying information is usable to select or retrieve from the profile server the particular predefined DEQ spectral profile to use with the loudspeaker. In some embodiments, the identifying information includes a date of manufacture so that age-specific predefined DEQ profiles can be used. Other components of a reproduction system similarly can include such identifying information.

In some embodiments that include automatically selecting the predefined DEQ spectral profile according to one or more characteristics of the reproduction apparatus, the identifying information is used for the automatic selecting. In some versions, the automatic selecting is from a set of predefined DEQ spectral profiles stored in the audio signal processing apparatus, while in others, in the case the audio signal processing apparatus is in communication with a profile server via a network, the automatic selecting includes requesting the desired profile from the profile server.

In some embodiments, the selected predefined DEQ spectral profile includes an environment-specific DEQ spectral profile that takes into account the reproduction environment. The characteristics of the reproduction environment can be measured and a profile created. However, in many situations, a predefined spectral profile provided by the device manufacturer, or by a third party can be used. Such an environment-specific DEQ spectral profile takes into account the type of reproduction environment. As an example, the type of reproduction environment is one of a set of reproduction environments that includes a small room, a large room, and an automobile. Therefore, a user when listening in an automobile can select a predefined environment-specific DEQ spectral profile for an automobile.

It should be clear that one also can combine one or more predefined device specific DEQ spectral profiles with a predefined environment-specific DEQ spectral profile.

Equalization-type Specific Deq Spectral Profile

In some embodiments, the predefined DEQ spectral profile selected for use in dynamic equalization includes a predefined DEQ spectral profile that is specific to an equalization-type. Many types of equalizations are known. Examples of equalization types include boost treble equalization, boost bass equalization, and flatten equalization. One embodiment provides a control interface that accepts a selection of one of a set of predefined DEQ spectral profile that includes boost treble equalization, boost bass equalization, and flatten equalization. Of course fewer or more choices may be provided in different embodiments.

Content-specific DEQ Spectral Profiles

In some embodiment, the predefined DEQ spectral profile used on an audio signal includes a predefined content-specific DEQ spectral profile to equalize according to the content or type of content represented by the audio signal to be processed.

As an example of predefined content-specific DEQ spectral profile, it is generally accepted that different types of music can be equalized using a DEQ spectral profile that is specific to the music, or at least to the type of music. For example, a listener of heavy metal rock n roll likely would prefer equalization that is different than a listener of classical chamber music, or of a Jazz vocal ballad. Sound content can be categorized in many ways into types of sound.

In some embodiments, the content-specific DEQ spectral profile is one of a set of content-type specific predefined DEQ spectral profiles.

The inventors envisage combining a set of one or more content-specific DEQ spectral profiles with the content itself, so that a listener may select from a set of content-specific DEQ spectral profiles when listening to the content.

Other embodiments include using a predefined DEQ spectral profile that is specific to the actual content. Consider the following example. There are sound engineers that are relatively famous. They are called "celebrity sound engineers" herein. A listener of a particular item of content, e.g., a particular piece of music, may like to listen to that music as equalized by any one of a set of such celebrity sound engineers. In some embodiments of the invention, the selecting is according to the content being played back, and according to a selection of a content-specific DEQ spectral profile from a set of content-specific DEQ spectral profiles that match the content being played back.

While one model for distributing such celebrity sound engineer profiles is by including the profiles with the content when the content is distributed, in other embodiments, the content includes an identifier of the content sufficient to retrieve a set of one or more matching content-specific predefined DEQ spectral profiles, e.g., from a profile server such as profile server 511. In another, a content identification method is used to identify the content, e.g., using a signature obtained of the content, and automatically obtain a match from a content matching service, e.g., from a profile server such as server 511. Many such content matching services are known that use a small portion of content and determine a signature that can be used to search an extensive database of music and other content.

Authentication

The inventors of the present invention recognize that there is value in a predefined DEQ spectral profile. An entity that creates such profiles may want to protect the authenticity of such a profile. This provides, for example, confidence to a listener that the selected predefined DEQ spectral profile is what it claims to be, that is, that it is authentic.

Many methods are known for ensuring the authenticity of digital data. For example, public key cryptographic methods are known for signing data so that a consumer, using a public key can check authenticity of data by checking of the public key decrypts data that was encrypted by the corresponding private key.

Figure 6:
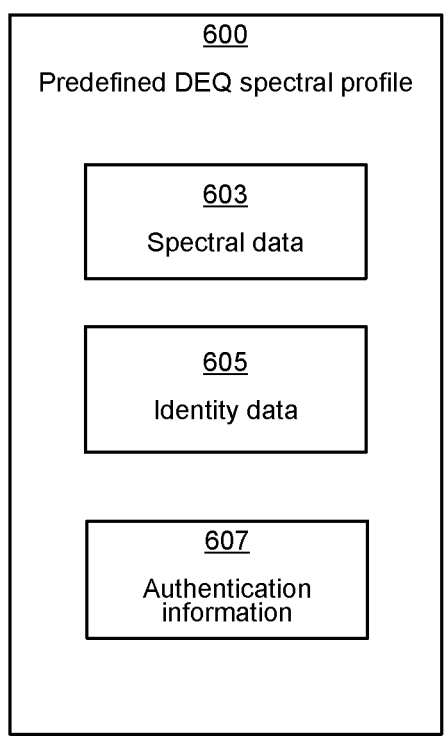
FIG. 6 shows in the form of a simple block diagram one example of the contents of a predefined DEQ spectral profile.

FIG. 6 shows in the form of a simple block diagram one example of the contents of a predefined DEQ spectral profile 600. In such an embodiment, the predefined DEQ spectral profile 600 includes a set of numbers that define the profile's spectral data 603, identity data 605 that identifies the manufacturer or creator of the predefined DEQ spectral profile 600, and authentication information 607 comprising the result of applying the private key of a private/public cryptographic key pair to a function of the profile data 603. Different embodiments use different functions of the profile data. Some embodiments of the invention use a cryptographic hash function. As would be known to those skilled in the art, a cryptographic hash function is a deterministic procedure that takes an arbitrary amount of data and returns a fixed-size bit string, called the (cryptographic) hash value, such that an accidental or intentional change to the data will change the hash value. The data to be encoded is often called the "message", and the hash value is sometimes called the message digest or simply digest. In the case of the present invention, the message is the set of spectral values that form the DEQ spectral profile. There are many cryptographic hash functions known, and the invention is not limited to the type of hash function used.

The main desirable properties of a hash function as used herein include it being relatively easy to compute, given a hash function value, it is infeasible to find the data a message that has the given hash, it is infeasible to change the content of the message (the spectral values) without changing its hash, and it is infeasible to find two different messages having the same hash. For a list of commonly used hash functions, see the Wikipedia article "Cryptographic hash function," retrieved on 7 Jul. 2009 from en*dot*wikipedia*dot*org/wiki/Cryptographic hash function, where *dot* denotes the period "." in the actual URL.

One embodiment of the invention uses the common MD5 hash function. Another uses the common SHA-1 hash function.

Thus the authenticity data in a profile is the result of encrypting a hash function of the spectral data for the profile. The encrypting uses the private key corresponding to the profile creator.

Note that in one embodiment, the spectral data of the profile is provided in unencrypted form so that it is possible to use the spectral data of the profile without checking authenticity. In some embodiments, therefore, an audio signal processing apparatus has a choice of whether or not to determine authenticity. In another embodiment, an audio signal processing apparatus in operation determines authenticity before using the spectral data of the profile.

Thus, in some method embodiments, predefined spectral profiles include authentication information and spectral data, and the method of operating the audio signal processing system 523 includes ascertaining whether a particular predefined DEQ spectral profile is usable as the selected predefined DEQ profile by comparing the authentication information to a function of the spectral data.

Also, in some apparatus embodiments, predefined spectral profiles include authentication information and spectral data, and the processors 205 of the audio signal processing system 523 are configured in operation to ascertaining whether a particular predefined DEQ spectral profile is usable as the selected predefined DEQ profile by comparing the authentication information to a function of the spectral data.

In more detail, to determine authenticity, one embodiment of the audio signal processing apparatus, in operation:
- determines the unique function of the spectral data 603 in the predefined profile;
- obtains the public key of the key pair corresponding to the manufacturer or creator of the profile using the identity information 605;
- decrypts the encrypted information 607; and
- compares the determined hash function with the decrypted version of the authentication information 607.

An Authentication Server

Some embodiments include carrying out authentication in a processing system other than the audio signal processing system such as system 523. As shown in FIG. 5, in some embodiments, the profile server includes, or is coupled to an authentication processing system. In the version shown in FIG. 5, the profile server 511 is coupled via network 501 to an authentication server 531. The authentication server 531 includes one or more processors 534, and includes or is coupled to an authentication storage subsystem 535 in which a set of authentication parameters 539 is stored. Each predefined spectral profile includes authentication information 607 and also identification information. A signal processing apparatus such as apparatus 521 is able to request the server processing system to authenticate a particular predefined DEQ spectral profile, or in an alternate embodiment, request information from the server processing system, and the server processing system can, by connecting to the authentication processing system ascertain the authenticity of a particular predefined DEQ spectral profile.

Thus, in one method embodiment of operating an audio signal processing apparatus such as apparatus 531, the method includes sending a request to an authentication processing system coupled to or part of the profile server processing system to authenticate a particular predefined DEQ spectral profile; and receiving an authenticity parameter from the authentication processing system indicative of the state of authenticity of the profile, and ascertaining whether the particular predefined DEQ spectral profile is usable as the selected predefined DEQ profile according to the received authenticity parameter.

Thus, one embodiment of the server processing system 513 is configured in operation to send a request to an authentication processing system 533 coupled to the network 501, the request being to authenticate a particular predefined DEQ spectral profile. Again, the authenticating processing system 533 including or coupled to an authentication storage subsystem 535 in which a set of authentication parameters 539 is stored. The one or more processors 514 are further configured in operation to receive an authenticity parameter from the authentication processing system 533, and to ascertain whether the particular predefined DEQ spectral profile is usable as the selected predefined DEQ profile according to the received authenticity parameter.

The authentication server if separate from the profile server as shown in FIG. 5 includes one or more processors 534, and instruction in the storage subsystem 535 that when executed cause the authentication server to carry out an authentication process, e.g., to generate or look for the particular authentication parameter 539 for a particular spectral profile.

Creating Profiles

Another aspect of the invention includes creating predefined DEQ spectral profiles for distribution.

Although any processing system can be used, for purposes of illustration, the profile server processing system is assumed.

Thus, some embodiments include a method operating a processing system to create one or more predefined DEQ spectral profiles.

In some embodiments, the creating includes creating authenticating information for inclusion in each created predefined DEQ spectral profile to enable an authentication method to authenticate each created predefined DEQ spectral profile. In some embodiments, each created predefined DEQ spectral profile includes identity data to identify the creator of the profile. In the case the created profile includes information, e.g., the authentication information that is encrypted using the private key of a public/private key pair, the identity information 605 to enable an authentication method to obtain the matching public key for each private key used.

In some embodiments, the creating further includes sending authentication information on the created predefined DEQ spectral profiles to an authentication processing system that includes or is coupled to an authentication storage subsystem such that the authentication processing system in operation can store a set of authentication parameters for a set of one or more authentic predefined DEQ spectral profiles.

In this manner, a manufacturer or profile supplier can create and publish predefined DEQ spectral profiles, e.g., device-specific and/or device-type specific, and/or reproduction environment type specific DEQ spectral profiles, and/or content-specific DEQ spectral profiles, and/or equalization-type specific DEQ spectral profiles.

The Control Interface

Some embodiments include a control interface for selecting the selected predefined DEQ spectral profile to use, and for how the selected profile is used to process an input audio signal. Related U.S. Provisional Patent Application No. 61/181,206 describes various control interfaces for a signal processing apparatus that carries out dynamic equalization, either perceptual domain dynamic equalization (PDEQ), or the broader not necessarily perceptual domain dynamic equalization (DEQ) in which the time varying spectrum of an input signal is modified to more closely resemble a function of a time invariant spectral profile.

One feature of embodiments of the present invention includes a method and apparatus for a user to interact with a DEQ processing system or device. Such interactions including presenting a control interface to a user, and accepting settings by the user of control elements in the control interface. As an example, the system shown in FIG. 2B includes a control interface 219 that includes a user interface display for presenting controls, and at least one control element (the user input mechanism 217) configured to accept a user input. Alternate embodiments for the control interface can include traditional components such as knobs, sliders, and so forth.

In some embodiments, the control interface provides a control for selecting and/or defining the DEQ spectral profile to use. The selecting includes accepting from a control interface a user-defined DEQ spectral profile based on a blending of at least the selected predefined DEQ spectral profile and optionally one or more other DEQ spectral profiles, the blending based on a set of one or more blending parameters. The control interface provides a mechanism for a user to set the one or more blending parameters. In the case that there is a single selected predefined DEQ spectral profile, there is a single blending parameter indicative of the amount of DEQ to apply according to the single DEQ spectral profile. The processing of the audio signal is according to the user-defined DEQ spectral profile. Some such embodiments include presenting the control interface to the user. As described in more detail herein below, the control interface includes one or more control elements configured to accept a user input including values for at least some of the set of one or more blending parameters.

In some embodiments, the control interface further includes at least one control element for selecting or otherwise defining the selected predefined DEQ spectral profile and if one or more other DEQ spectral profiles are used the other one or more other DEQ spectral profiles.

As one example, described in more detail below, the blending is of one or more pairs of selected predefined DEQ spectral profiles. The control interface includes a control element for setting one or more blending parameters to determine the respective relative amounts of blending of respective one or more pairs of the selected predefined DEQ spectral profiles to form the user-defined DEQ spectral profile used for the processing of the audio signal.

These control interface features are now described in more details.

In one set of embodiments, the existence of a selected predefined DEQ preset spectral profile, denoted EQ[b] and a variable degree of DEQ processing, denoted β and being between 0 (no DEQ processing) and 1 (complete DEQ processing), or also expressible as a percentage, provides a simple parameter that allows a user of a media device such as implemented in FIG. 2B. FIG. 7A shows one embodiment that includes a slider and FIG. 7B shows an embodiment in the form of a rotary knob, each for controlling the amount of DEQ processing according to a predefined DEQ spectral profile EQ[b]. The slider or knob in some versions is an actual physical slider or rotary knob, and in other versions, a virtual control in the form of a display of a knob rendered on a graphical user interface display 215 with which a user can interact. The slider (FIG. 7A) or knob (FIG. 7B) position selects the amount of DEQ to apply according to the position of the DEQ controller. The slider or knob position is accepted and, in some embodiments, perceptual DEQ processing is applied to an audio signal according to Eqns. 8, 12, and 13, or in other embodiments, DEQ processing according to Eqns. 17 and 18. That is, for the case of perceptual DEQ, the preset specific loudness and the gains are determined according to Eqns. 8, 12 and 13. The audio is processed according to the determined multi-band gains.

In some embodiments, the audio processing system includes the ability to store a plurality of predefined DEQ spectral profiles. Each of these may be recalled by a user. Thus, in some embodiments, the control interface includes at least one control element for selecting one or more DEQ preset spectral profiles from a set of DEQ preset spectral profiles.

Some embodiments include a control interface that is manipulated by a user to select a selected DEQ spectral profile between two predefined DEQ spectral profiles denoted $EQ_1[b]$ and $EQ_2[b]$. In some embodiments, the control interface includes at least one control element for selecting two preset spectral profiles, and a control element (a slider or knob) for setting a parameter called the morphing parameter, also the blending parameter, in order to determine a blending of the two predefined DEQ spectral profiles for the audio output. The selecting of the two predefined DEQ spectral profiles is from a set of predefined DEQ spectral profiles, e.g., stored, predefined DEQ spectral profiles that were selected in the factory by the manufacturer, or predefined DEQ spectral profiles.

FIG. 8A shows a slider, and FIG. 8B shows a knob. The slider or knob when manipulated sets the morphing parameter, denoted $\alpha$, $0 \leq \alpha \leq 1$, such that the EQ[b] applied in some perceptual DEQ processing embodiments according to Eqns. 8, 12, and 13, or in other DEQ processing embodiments, according to Eqns. 17 and 18, is a linear combination of the two predefined DEQ spectral profiles determined by the parameter $\alpha$:

$$EQ[b] = \alpha \cdot EQ_2[b] + (1-\alpha) \cdot EQ_1[b]. \qquad (19)$$

In one embodiment, the parameter β in Eqn. 12 or Eqn. 18 is set to a fixed value of 1. In an alternate embodiment, an additional control interface, e.g., an additional slider or knob is provided to the user to select the parameter β.

As shown in FIG. 8A, when the slider is set to the bottom position, or $\alpha=0$ then the audio signal is fully processed using predefined DEQ spectral profile $EQ_1[b]$. As the slider is moved and the value of $\alpha$ increased, the applied predefined DEQ spectral profile applied is a combination of the two predefined DEQ spectral profiles $EQ_1[b]$ and $EQ_2[b]$ until the value of $\alpha$ is increased to its full value of 1 when the predefined DEQ spectral profile applied is fully $EQ_2[b]$.

Control Between more than Two Preset Spectral Profiles

Figures 9A, 9B:
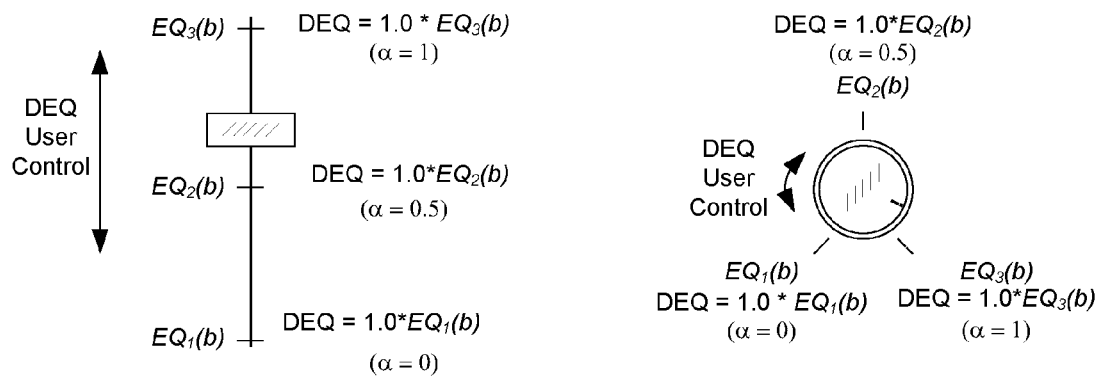
FIGS. 9A and 9B show a slider control interface and a knob control interface, respectively, each providing a user control of the application of three different dynamic equalization predefined DEQ spectral profiles on a media device according to some embodiments of the present invention.

In some embodiments, the control interface for DEQ processing includes the control and application of a selected DEQ spectral profile formed as a combination of more than two predefined DEQ spectral profiles. In such usage, a user selects three or more predefined DEQ spectral profiles from a set of predefined DEQ spectral profiles that may be factory defined. The control interface allows a user to determine a predefined DEQ spectral profile that morphs between pairs of the three or more selected predefined DEQ spectral profiles. The three or more selected predefined DEQ spectral profiles are spatially distributed on different positions on the control elements, e.g., slider or knob of the control interface that are configured to accept user input via respective input mechanism(s). FIG. 9A shows a slider, and FIG. 9B shows a knob applicable to the case of applying a morphing of a pair of predefined DEQ spectral profiles selected from three predefined DEQ spectral profiles denoted $EQ_1[b]$, $EQ_2[b]$, and $EQ_3[b]$. The user adjusts the control element, e.g., knob or slider, to select a blending of a pair of predefined DEQ spectral profiles according to the preset blending parameter (also called morphing parameter) denoted $\alpha$, defined in the case of three selected predefined DEQ spectral profiles such that the EQ[b] applied in some perceptual DEQ processing embodiments according to Eqns. 8, 12, and 13, or in other DEQ processing embodiments, according to Eqns. 17 and 18 is set equal to:

$$EQ[b]=2\alpha \cdot EQ_2[b]+(1-2\alpha) \cdot EQ_1[b] \text{ for } 0 \leq \alpha \leq 0.5 \quad (20)$$

and $$EQ[b]=2(\alpha-0.5) \cdot EQ_3[b]+(1-2(\alpha-0.5)) \cdot EQ_2[b] \text{ for } 0.5<\alpha \leq 1.0 \quad (21)$$

where in some embodiments, the parameter β(as used in Eqn. 12 or Eqn. 18) is set to a fixed value of 1 for full effect. In alternate embodiments, the control interface further includes a control element for controlling the amount of the overall DEQ processing that is applied, e.g., by an additional control interface, e.g., an additional slider or knob is provided to the user to select the parameter β.

Deq Control Interface using a Two-dimensional Control Element

Further embodiments of the invention include a control interface that includes a two dimensional control element configured to accept a user indication of a location on an area defining the two-dimensional control element. Examples of a control interface with a two dimensional control element include a touchpad used to control the cursor found on most computer laptops, a trackball in combination with a displayed two dimensional surface, and a displayed two dimensional surface in a touch sensitive screen. Such control interfaces with two dimensional control elements recently also appear in devices such as cellular telephones and portable media devices.

Figure 10:
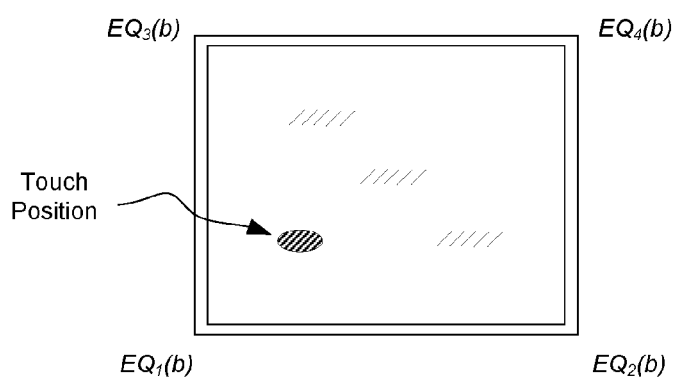
FIG. 10 shows a control interface with a two dimensional user control element of a control interface for control of the application of four dynamic equalization predefined DEQ spectral profiles according to some embodiments of the present invention.

FIG. 10 shows one such control interface for selecting a DEQ spectral profile to apply from a morphing of a pair of any of the four predefined spectral profiles, denoted $EQ_1[b]$, $EQ_2[b]$, $EQ_3[b]$, and $EQ_4[b]$.

An Integrated Controller for Dynamic Equalization Preset Selection and Control

The parameter β and a predefined DEQ spectral profile EQ[b] (Eqn. 12 or Eqn. 18, depending on the type of DEQ) together provide a relatively simple manner that can be used in a media device to control the perceived spectrum of an audio signal. Furthermore, one of a plurality of predefined DEQ spectral profiles can be used, each for example applicable to a different reproduction situation or environment. One aspect of the present invention is a control interface that provides for a user a mechanism to easily select one of a set of predefined DEQ spectral profiles EQ[b] and to control the amount of DEQ being applied by controlling of the parameter β (Eqn. 12 or Eqn. 18, depending on the type of DEQ). Some versions include a mechanism to capture and store a desired spectral profile from an input audio signal. In one embodiment, the predefined DEQ spectral profiles are stored on a device. In another embodiment, universal resource locators (URLs) or pointers to the respective predefined DEQ spectral profiles are stored in the device.

In some embodiments, the control interface includes a display element for displaying a selection and an integrated element that provides for a control element for adjusting, e.g., adjusting the amount of DEQ to apply and a control element for indicating, e.g., for indicating a choice. As an example, in some embodiments, the control element for adjusting is a rotary control element, and the control element for indicating is by a click control element integrated with the rotary control element.

Figures 11A, 11B:
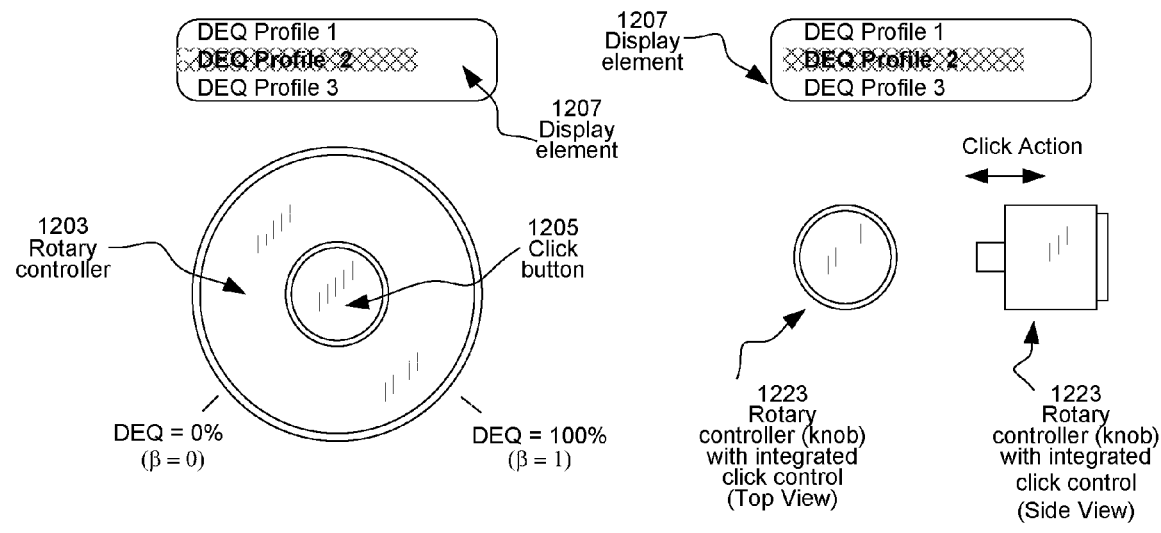
FIGS. 11A and 11B show two alternate embodiments of a control interface for integrated dynamic equalization control including selecting a dynamic equalization preset profile and varying the amount of dynamic equalization applied, according to some embodiments of the present invention.

FIGS. 11A and 11B show two alternate embodiments of a control interface for integrated DEQ control including selecting a predefined DEQ profile and varying the amount of DEQ applied. FIG. 11A shows a control interface that includes an annular rotary controller 1203, which can be an actual physical controller, or a virtual controller in the form of a display with which a user can interact. The rotary control is used as the control element for adjusting. The control interface includes a region 1205 that acts as a push button, also commonly called a click button. The click button is used as the control element for indicating. In the particular arrangement shown, the click button 1205 fills the center void region of the annular rotary controller 1203. The control interface includes a display element 1207 configured to display actions being performed to provides a user visual feedback.

FIG. 11B shows one alternative control interface in which the rotary controller and selection mechanism are combined into element 1223: a rotary controller, e.g., a knob with integrated click control. A top view and a side view is shown in FIG. 11B, as is the display element 1207.

In some embodiments, the control interface with the integrated rotary controller and the click button (FIG. 11A or FIG. 11B) has a plurality of modes, including a selection mode in which the rotary controller is used to choose a particular predefined DEQ spectral profile of a plurality of predefined DEQ spectral profiles, and the click button is used to indicate applying the particular predefined DEQ spectral profile.

As one example, the modes include a control mode in which the rotary controller is used to control the amount of DEQ to apply, and the click button indicating is used to change modes. Furthermore, in some embodiments, the modes include a save mode in which the rotary controller is used to select a storage location to store a particular predefined DEQ spectral profile as one of the predefined spectral profiles, and the click button is used both to change modes and to save the particular predefined DEQ spectral profile as one of the predefined spectral profiles at the selected storage location.

Unless specifically stated otherwise, as apparent from the following description, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps is implied, unless specifically stated.

In some embodiments, a computer-readable storage medium is configured with, e.g., encoded with instructions that when executed by one or more processors of a processing system such as a digital signal processing device or subsystem that includes at least one processor element and a storage subsystem, cause carrying out a method as described herein.

The methodologies described herein are, in some embodiments, performable by one or more processors that accept logic, instructions encoded on one or more computer-readable media. When executed by one or more of the processors, the instructions cause carrying out at least one of the methods described herein. Any processor capable of executing a set of instructions (sequential or otherwise) that specify actions to be taken are included. Thus, one example is a typical processing system that includes one or more processors. Each processor may include one or more of a CPU or similar element, a graphics processing unit, and/or a programmable DSP unit. The processing system further may include storage subsystem that includes a memory subsystem including main RAM and/or a static RAM, and/or ROM. A bus subsystem may be included for communicating between the components. The processing system further may be a distributed processing system with processors coupled by a network, e.g., via network interface devices or wireless network interface devices. If the processing system requires a display, such a display may be included, e.g., a liquid crystal display (LCD), organic light emitting display (OLED), or a cathode ray tube (CRT) display. If manual data entry is required, the processing system also includes an input device such as one or more of an alphanumeric input unit such as a keyboard, a pointing control device such as a mouse, and so forth. The term storage device, storage subsystem, or memory unit as used herein, if clear from the context and unless explicitly stated otherwise, also encompasses a storage system such as a disk drive unit. The processing system in some configurations may include a sound output device, and a network interface device. The memory subsystem thus includes a computer-readable medium that is configured with, e.g., encoded with instructions, e.g., logic, e.g., software that when executed by one or more processors, causes carrying out one of more of the method steps described herein. The software may reside in the hard disk, or may also reside, completely or at least partially, within the RAM and/or within the processor during execution thereof by the computer system. Thus, the memory and the processor also constitute computer-readable medium on which are encoded instructions.

Furthermore, a computer-readable medium may form a computer program product, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The term processing system encompasses all such possibilities, unless explicitly excluded herein. The one or more processors may form a personal computer (PC), a media playback device, a netbook, a tablet PC, a set-top box (STB), a Personal Digital Assistant (PDA), a cellular telephone, a Web appliance, a network router, switch or bridge, or any machine capable of executing a set of instructions (sequential or otherwise) that specify actions to be taken by that machine.

Note that while some diagram(s) only show(s) a single processor and a single storage subsystem, e.g., a single memory that stores the logic including instructions, those skilled in the art will understand that many of the components described above are included, but not explicitly shown or described in order not to obscure the inventive aspects. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer-readable medium configured with a set of instructions, e.g., a computer program that when executed on one or more processors, e.g., one or more processors that are part of a media device, cause carrying out of method steps. Thus, as will be appreciated by those skilled in the art, embodiments of the present invention may be embodied as a method, an apparatus such as a special purpose apparatus, an apparatus such as a data processing system, or a computer-readable storage medium, e.g., as a computer program product. The computer-readable medium is configured with a set of instructions that when executed by one or more processors cause carrying out method steps. Accordingly, aspects of the present invention may take the form of a method, an entirely hardware embodiment, an entirely software embodiment or an embodiment combining software and hardware aspects. Furthermore, the present invention may take the form of computer readable medium, e.g., a computer program product as a computer-readable storage medium with computer-readable program code embodied in the medium.

While the computer readable medium is shown in an example embodiment to be a single medium, the term "computer readable medium" should be taken to include a single medium or multiple media, e.g., a centralized storage device for a centralized database, or distributed storage for a distributed database, and/or associated caches and servers that store the one or more sets of instructions. The term "computer readable medium" shall also be taken to include any tangible storage medium that is capable of storing or encoding instructions for execution by one or more of the processors and that cause the one or more processors to perform method steps of any one or more of the methodologies of the present invention. A computer readable medium may take many forms, including but not limited to, non-volatile media and/or volatile media. Non-volatile media includes, for example, optical storage, magnetic disks, and/or magneto-optical disks. Volatile media includes dynamic memory, such as main memory. For example, the term "computer readable medium" shall accordingly be taken to be included, but not be limited to, in one set of embodiment, a tangible computer-readable medium, e.g., a solid-state memory, or a computer software product encoded in computer-readable optical or magnetic media.

It will be understood that the steps of methods discussed are performed in one embodiment by an appropriate processor (or processors) of a processing (i.e., computer) system executing instructions stored in storage. It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, into one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patents, U.S. patent applications, and International (PCT) patent applications designating the United States cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of operating an audio signal processing apparatus to process an audio signal, the method comprising:
   accepting an audio signal;
   selecting a predefined dynamic equalization (DEQ) spectral profile from a plurality of predefined spectral profiles that are locally stored or that have been remotely stored;
   processing the audio signal using the audio signal processing apparatus according to the selected predefined DEQ spectral profile to generate a processed audio signal, the processing including determining a spectral measure that is modified, including carrying out perceptual domain dynamic equalization, to dynamically adjust the time-varying spectral profile of the audio signal to more closely match a time invariant spectral profile according to the selected predefined DEQ spectral profile, the processed audio signal being for playback in a reproduction environment using a reproduction apparatus,
      wherein the plurality of predefined DEQ spectral profile includes:
      at least one device-specific DEQ spectral profile to equalize for one or more characteristics of the reproduction apparatus, or one or more characteristics of the reproduction environment, or characteristics of both the reproduction environment and the reproduction apparatus, and/or
      at least one content-specific DEQ spectral profile to equalize according to the content or type of content represented by the audio signal, and/or
      at least one equalization-type specific DEQ spectral profile to equalize according to a type of equalization effect wherein the equalizing according to the type of equalization effect is boost treble equalization, boost bass equalization, or flatten equalization.

2. A method as recited in claim 1, wherein the selected predefined DEQ spectral profile includes a device-specific DEQ spectral profile that takes into account the age of one or more components of the reproduction apparatus.

3. A method as recited in claim 1, wherein the plurality of predefined DEQ spectral profile includes at least one device-classification-specific DEQ, and wherein the selected predefined DEQ spectral profile includes a device- classification-specific DEQ spectral profile that takes into account a classification of the reproduction apparatus into one of a plurality of device classifications.

4. A method as recited in claim 3, wherein the reproduction apparatus classification is one of a set of reproduction apparatus classifications that includes at least one of an amplifier type, a loudspeaker type, a small headphone reproduction apparatus, a small loudspeaker reproduction apparatus, and a full bass response speaker reproduction apparatus.

5. A method as recited in claim 1, wherein the plurality of predefined DEQ spectral profile includes at least one environment-type-specific DEQ, and wherein the selected predefined DEQ spectral profile includes an environment-type-specific DEQ spectral profile that takes into account a type of reproduction environment.

6. A method as recited in claim 1, wherein the selected predefined DEQ spectral profile includes an equalization-type-specific DEQ spectral profile to equalize according to a type of equalization effect, and wherein the equalizing according to the type of equalization effect is boost treble equalization, boost bass equalization, or flatten equalization.

7. A method as recited in claim 1, wherein the selecting includes automatically selecting, the automatically selecting including at least one of:
automatically selecting according to one or more characteristics of the reproduction apparatus, and
automatically selecting a content-specific DEQ spectral profile to equalize according to the content or type of content represented by the audio signal, the automatic selecting being according to the content or type of content represented by the audio signal.

8. A method as recited in claim 1, wherein the selecting includes accepting user input from a control interface included in the audio signal processing apparatus.

9. A method as recited in claim 1, wherein the selecting includes accepting from a control interface a user-defined DEQ spectral profile based on a blending of at least the selected predefined DEQ spectral profile and one or more other DEQ spectral profiles, the blending based on a set of one or more blending parameters, wherein the control interface provides a mechanism for a user to set the one or more blending parameters, wherein the processing of the audio signal is according to the user-defined DEQ spectral profile.

10. A method as recited in claim 9, further comprising:
presenting the control interface to the user, the control interface including one or more control elements configured to accept a user input including values for at least some of the set of one or more blending parameters.

11. A method as recited in claim 9, wherein the control interface further includes at least one control element for selecting or otherwise defining the selected predefined DEQ spectral profile and if one or more other DEQ spectral profiles are used, for selecting or otherwise defining the other one or more other DEQ spectral profiles.

12. A method as recited in claim 9, wherein the blending is of one or more pairs of selected predefined DEQ spectral profiles, and wherein the control interface includes a control element for setting one or more blending parameters to determine the respective relative amounts of blending of respective one or more pairs of the selected predefined DEQ spectral profiles to form the user-defined DEQ spectral profile used for the processing of the audio signal.

13. A method as recited in claim 1, wherein the audio signal processing apparatus is coupled to a network to which a serving processing system is coupled, serving processing system including or coupled to a storage subsystem in which a set of predefined DEQ spectral profiles is stored, wherein the plurality of predefined spectral profiles are stored in the storage subsystem of the serving processing system, the method further comprising:
sending a request to the serving processing system for a particular predefined DEQ spectral profile; and
receiving the requested particular predefined DEQ spectral profile to be used as the selected predefined DEQ spectral profile.

14. A method as recited in claim 13, wherein the particular predefined spectral profile includes authentication information and spectral data, the method further, comprising:
ascertaining whether the particular predefined DEQ spectral profile is usable as the selected predefined DEQ spectral profile by comparing the authentication information to a function of the spectral data.

15. A method as recited in claim 14, wherein the authentication information is encrypted by an encryption method that can identify the creator or manufacturer of the profile, and wherein the ascertaining includes decrypting the authentication information.

16. A method as recited in claim 1, wherein the audio signal processing apparatus is coupled to a network to which an authentication processing system is coupled, the authenticating processing system including or coupled to a storage subsystem in which a set of authentication parameters is stored, the method further comprising:
sending a request to the authentication processing system to authenticate a particular predefined DEQ spectral profile; and
receiving an authenticity parameter from the authentication processing system, and
ascertaining whether the particular predefined DEQ spectral profile is usable as the selected predefined DEQ spectral profile according to the received authenticity parameter.

17. A method as recited in claim 1, further comprising playing back the processed audio signal in the reproduction environment using the reproduction apparatus.

18. A system for providing predefined DEQ spectral profiles for use by client processing systems, the system comprising:
one or more processors;
one of more non-transitory computer readable media forming a storage subsystem;
a network interface coupled to a network, such that the system can communicate with one or more audio signal processing apparatuses that are coupled to the network;
wherein the storage system stores a set of predefined dynamic equalization (DEQ) spectral profiles,
wherein the one or more processors are operative to send directly, or indirectly via a different processing system, one or more of the set of stored predefined DEQ spectral profiles to at least one audio signal processing apparatus coupled to the network, such that a particular audio signal processing apparatus, as a result of receiving a selected predefined DEQ spectral profile, is able to process an accepted audio signal according to the selected predefined DEQ spectral profile to generate a processed audio signal, the processing including determining a spectral measure that is modified, including carrying out perceptual domain dynamic equalization, to dynamically adjust the time-varying spectral profile of the audio signal to more closely match a time invariant spectral profile according to the selected predefined DEQ spectral profile, the processed audio signal being for playback in a reproduction environment using a reproduction apparatus;

wherein the set of stored predefined DEQ spectral profiles includes:
at least one device-specific DEQ spectral profile to equalize for one or more characteristics of a reproduction apparatus, or one or more characteristics of a reproduction environment in which the reproduction apparatus operated, or characteristics of both the reproduction environment and the reproduction apparatus,
at least one content-specific DEQ spectral profile to equalize according to the content or type of content represented by the audio signal to be processed, and
at least one equalization-type specific DEQ spectral profile to equalize according to a type of equalization effect wherein the equalizing according to the type of equalization effect is boost treble equalization, boost bass equalization, or flatten equalization.

19. A system as recited in claim 18, wherein the one or more processors are operative to receive a request from the particular audio signal processing apparatus coupled to the network for the selected predefined DEQ spectral profile, and in response to the request to send to the particular audio signal processing apparatus the selected predefined DEQ spectral profile, such that the audio signal processing apparatus, as a result of receiving the selected predefined DEQ spectral profile, processes the accepted audio signal according to the selected predefined DEQ spectral profile to generate the processed audio signal.

20. A system as recited in claim 18, wherein the set of predefined DEQ spectral profiles includes at least one environment-specific DEQ spectral profile that takes into account a type of reproduction environment.

21. A system as recited in claim 18, wherein the system comprises or is coupled to an authentication processing system that includes or is coupled to an authentication storage subsystem in which a set of authentication parameters is stored, and wherein each predefined spectral profile includes authentication information, such that the particular audio signal processing apparatus is able to request the system to authenticate a particular predefined DEQ spectral profile; and the system can, by connecting to the authentication processing system ascertain the authenticity of a particular predefined DEQ spectral profile.

22. An apparatus for selecting and using a predefined DEQ spectral profile to process an audio signal, the apparatus comprising:
one or more processors;
one or more non-transitory computer-readable media forming a storage subsystem configured with code that when executed on at least one of the processors, causes the apparatus to:
process the audio signal according to a selected predefined dynamic equalization (DEQ) spectral profile to generate a processed audio sigrial, the processing including determining a spectral measure that is modified, including carrying out perceptual domain dynamic equalization, to dynamically adjust the time-varying spectral profile of the audio signal to more closely match a time invariant spectral profile according to the selected predefined DEQ spectral profile, the processed audio signal being for playback in a reproduction environment using a reproduction apparatus;
wherein the selected predefined DEQ spectral profile is selected from a plurality of predefined DEQ spectral profiles that are locally stored, or that have been remotely stored, and
wherein the plurality of predefined DEQ spectral profile includes: at least one device-specific DEQ spectral profile to equalize for One or more characteristics of the reproduction apparatus, or one or more characteristics of the reproduction environment, or characteristics of both the reproduction environment and the reproduction apparatus,
at least one content-specific DEQ spectral profile to equalize according to the content or type of content represented by the audio signal, and
at least one equalization-type specific DEQ spectral profile to equalize according to a type of equalization effect wherein the equalizing according to the type of equalization effect is boost treble equalization, boost bass equalization, or flatten equalization.

23. An apparatus as recited in claim 22, further comprising a storage subsystem operative to store a set of predefined DEQ spectral profiles, and wherein the selected predefined DEQ spectral profile is one of the stored set of predefined DEQ spectral profiles.

24. An apparatus as recited in claim 22, wherein the one or more processors are operative to automatically select the selected predefined DEQ spectral profile according to one or more characteristics of the reproduction apparatus.

25. An apparatus as recited in claim 22, further comprising a control interface operative to accept user input of the selected predefined DEQ spectral profile.

26. An apparatus as recited in claim 22, further comprising:
a network interface coupled to a network,
wherein the one or more processors are operative to retrieve at least a particular predefined DEQ spectral profile from a serving processing system coupled to the network, the serving processing system including or coupled to a server storage subsystem in which a server set of predefined DEQ spectral profiles is stored, the retrieving comprising sending a request to the serving processing system for the particular predefined DEQ spectral profile; and receiving the requested particular predefined DEQ spectral profile, and
wherein the one or more processors are operative to send a request to an authentication processing system coupled to the network, the request being to authenticate the particular predefined DEQ spectral profile, the authenticating processing system including or coupled to an authentication storage subsystem in which a set of authentication parameters is stored, and
wherein the one or more processors are further operative-to receive an authenticity parameter from the authentication processing system, and to ascertain whether the particular predefined DEQ spectral profile is usable as the selected predefined DEQ spectral profile according to the received authenticity parameter.

27. An apparatus as recited in claim 22, further comprising:
a network interface coupled to a network,
wherein the one or more processors are operative to send a request to an authentication processing system coupled to the network, the request being to authenticate a particular predefined DEQ spectral profile, the authenticating processing system including or coupled to an authentication storage subsystem in which a set of authentication parameters is stored, and
wherein the one or more processors are further operative to receive an authenticity parameter from the authentication processing system, and to ascertain whether the particular predefined DEQ spectral profile is usable as the selected predefined DEQ spectral profile according to the received authenticity parameter.

28. An apparatus as recited in claim 22, wherein the selected predefined spectral profile includes authentication information and spectral data, and wherein the one or more processors are operative to:
ascertain whether the particular predefined DEQ spectral profile is usable as the selected predefined DEQ spectral profile by comparing the authentication information to a function of the spectral data.

29. An apparatus as recited in claim 28, wherein the authentication information is encrypted by an encryption method that can identify the creator or manufacturer of the profile, and wherein the ascertaining includes decrypting the authentication information.

30. A method of operating a processing system for providing predefined dynamic equalization (DEQ) spectral profiles for use by client processing systems, the processing system comprising one or more processors, a storage subsystem, and a network interface coupled to a network, such that the processing system can communicate with one or more audio signal processing apparatuses that are coupled to the network, the method comprising:
storing a set of predefined DEQ spectral profiles in the storage subsystem,
distributing directly, or via another processing system indirectly, one or more of the stored predefined DEQ spectral profiles to one or more audio signal processing apparatuses coupled to the network, such that a particular audio signal processing apparatus coupled to the network, as a result of receiving a selected predefined DEQ spectral profile, can process an accepted audio signal according to the selected predefined DEQ spectral profile to generate a processed audio signal, the processing including determining a spectral measure that is modified, including perceptual domain dynamic equalization to dynamically adjust the time-varying spectral profile of the audio signal to more closely match a time invariant spectral profile according to the selected predefined DEQ spectral profile, the processed audio signal being for playback in a reproduction environment using a reproduction apparatus;
wherein the plurality of stored predefined DEQ spectral profile includes
at least one device-specific DEQ spectral profile to equalize for one or more characteristics of a reproduction apparatus, or one or more characteristics of a reproduction environment in which the reproduction apparatus, or characteristics of both the reproduction environment and the reproduction apparatus,
at least one content-specific DEQ spectral profile to equalize according to the content or type of content represented by the audio signal to be processed, and
at least one equalization-type specific DEQ spectral profile to equalize according to a type of equalization effect wherein the equalizing according to the type of equalization effect is boost treble equalization, boost bass equalization, or flatten equalization.

31. A non-transitory computer-readable storage medium configured with instructions that when executed by one or more processors of a processing system, cause carrying out a method of process an audio signal, the method comprising:
accepting an audio signal;
automatically selecting, or accepting a from a user a selection of a predefined dynamic equalization (DEQ) spectral profile from a plurality of predefined spectral profiles that are locally stored or that have been remotely stored;
processing the audio signal using the audio signal processing apparatus according to the selected predefined DEQ spectral profile to generate a processed audio signal, the processing including determining a spectral measure that is modified, including perceptual domain dynamic equalization to dynamically adjust the time-varying spectral profile of the audio signal to more closely match a time invariant spectral profile according to the selected predefined DEQ spectral profile, the processed audio signal being for playback in a reproduction environment using a reproduction apparatus,
wherein the selected predefined DEQ spectral profile includes one or more of:
a device-specific DEQ spectral profile to equalize for one or more characteristics of the reproduction apparatus, or one or more characteristics of the reproduction environment, or characteristics of both the reproduction environment and the reproduction apparatus,
a content-specific DEQ spectral profile to equalize according to the content or type of content represented by the audio signal, and
an equalization-type specific DEQ spectral profile to equalize according to a type of equalization effect.

* * * * *

UNITED STATES PATENT AND TRADEMARK OFFICE
CERTIFICATE OF CORRECTION

| | | |
|---|---|---|
| PATENT NO. | : 8,929,567 B2 | Page 1 of 1 |
| APPLICATION NO. | : 13/300489 | |
| DATED | : January 6, 2015 | |
| INVENTOR(S) | : Crockett et al. | |

It is certified that error appears in the above-identified patent and that said Letters Patent is hereby corrected as shown below:

Specification

In Column 6 line 19 after "Equalization", kindly replace "(Pdeq)" with --(PDEQ)--.

In Column 14 line 59 before "Processing", kindly replace "Pdeq" with --(PDEQ)--.

In Column 17 line 36 after "Perceptual", kindly replace "Deq" with --DEQ--.

In Column 19 line 5 after "Predefined", kindly replace "Deq" with --DEQ--.

In Column 21 line 50 after "Predefined", kindly replace "Deq" with --DEQ--.

In Column 21 line 58 before "Spectral", kindly replace "Deq" with --DEQ--.

In Column 23 line 25 before "Spectral", kindly replace "Deq" with --DEQ--.

In Column 29 line 18 before "Control", kindly replace "Deq" with --DEQ--.

Claims

In Column 37 line 53 Claim 22 after "audio", kindly replace "sigrial" with --signal--.

In Column 38 line 1 Claim 22 after "equalize for", kindly replace "One" with --one--.

Signed and Sealed this
Twenty-seventh Day of October, 2015

Michelle K. Lee
*Director of the United States Patent and Trademark Office*